(12) United States Patent
Kobayashi

(10) Patent No.: US 10,258,971 B2
(45) Date of Patent: Apr. 16, 2019

(54) PHOTOCATALYST ELECTRODE AND ARTIFICIAL PHOTOSYNTHESIS MODULE

(71) Applicants: FUJIFILM Corporation, Tokyo (JP); Japan Technological Research Association of Artificial Photosynthetic Chemical Process, Tokyo (JP)

(72) Inventor: Hiroyuki Kobayashi, Kashiwa (JP)

(73) Assignees: FUJIFILM Corporation, Tokyo (JP); JAPAN TECHNOLOGICAL RESEARCH ASSOCIATION OF ARTIFICIAL PHOTOSYNTHETIC CHEMICAL PROCESS, Tokyo (JP)

( * ) Notice: Subject to any disclaimer, the term of this patent is extended or adjusted under 35 U.S.C. 154(b) by 0 days.

(21) Appl. No.: 16/005,038

(22) Filed: Jun. 11, 2018

(65) Prior Publication Data

US 2018/0290129 A1  Oct. 11, 2018

Related U.S. Application Data

(63) Continuation of application No. PCT/JP2016/080599, filed on Oct. 14, 2016.

(30) Foreign Application Priority Data

Dec. 22, 2015 (JP) .................................. 2015-249499

(51) Int. Cl.
*B01J 27/045* (2006.01)
*B01J 35/02* (2006.01)
(Continued)

(52) U.S. Cl.
CPC ............ *B01J 27/045* (2013.01); *B01J 35/02* (2013.01); *C01B 3/04* (2013.01); *C25B 1/04* (2013.01);
(Continued)

(58) Field of Classification Search
None
See application file for complete search history.

(56) References Cited

U.S. PATENT DOCUMENTS

| 2016/0010218 A1* | 1/2016 | Higashi ................. C25B 11/04 204/252 |
| 2016/0017506 A1 | 1/2016 | Sato |
| 2016/0281241 A1 | 9/2016 | Higashi et al. |

FOREIGN PATENT DOCUMENTS

| JP | 2004-256378 A | 9/2004 |
| JP | 2007-117811 A | 5/2007 |

(Continued)

OTHER PUBLICATIONS

English translation of 2015-113516A (Year: 2015).*

(Continued)

*Primary Examiner* — Melvin C. Mayes
*Assistant Examiner* — Stefanie J Cohen
(74) *Attorney, Agent, or Firm* — Birch, Stewart, Kolasch & Birch, LLP

(57) ABSTRACT

A photocatalyst electrode decomposes water with light to generate gas. The photocatalyst electrode has a laminate including a substrate, a conductive layer provided on a surface of the substrate, and a photocatalyst layer provided on a surface of the conductive layer, and a first co-catalyst electrically connected to the photocatalyst layer. The light is incident from the surface side of the photocatalyst layer of the laminate, and in a case where a region where the light is incident on the surface of the photocatalyst layer and above the surface is defined as a first region and the region other than the first region is defined as a second region, the first co-catalyst is provided at least in the second region. The first co-catalyst and the photocatalyst layer are electrically connected to each other by at least one of a transparent conductive layer provided on the surface of the photocatalyst layer or a wiring line.

20 Claims, 8 Drawing Sheets

(51) Int. Cl.
- *C01B 3/04* (2006.01)
- *C25B 1/04* (2006.01)
- *C25B 9/00* (2006.01)
- *C25B 9/16* (2006.01)
- *C25B 11/04* (2006.01)
- *H01L 31/0216* (2014.01)

(52) U.S. Cl.
CPC ............ *C25B 9/00* (2013.01); *C25B 9/16* (2013.01); *C25B 11/04* (2013.01); *H01L 31/02161* (2013.01); *Y02E 60/364* (2013.01); *Y02E 60/366* (2013.01)

(56) References Cited

FOREIGN PATENT DOCUMENTS

| | | |
|---|---|---|
| JP | 2007-252974 A | 10/2007 |
| JP | 2008-104899 A | 5/2008 |
| JP | 2012-46385 A | 3/2012 |
| JP | 2012-50913 A | 3/2012 |
| JP | 2014-189882 A | 10/2014 |
| JP | 2014-189883 A | 10/2014 |
| JP | 2015-113516 A | 6/2015 |
| JP | 2015113516 A * 6/2015 ......... H01L 31/0749 |

OTHER PUBLICATIONS

Japanese Notification of Reasons for Refusal for corresponding Japanese Application No. 2017-557754, dated Aug. 14, 2018, with English translation.

International Search Report for PCT/JP2016/080599 dated Nov. 8, 2016.

Written Opinion of the International Searching Authority for PCT/JP2016/080599 dated Nov. 8, 2016.

Japanese Decision of Refusal for corresponding Japanese Application No. 2017-557754, dated Nov. 6. 2018, with English translation.

* cited by examiner

PHOTOCATALYST ELECTRODE AND ARTIFICIAL PHOTOSYNTHESIS MODULE

CROSS-REFERENCE TO RELATED APPLICATIONS

This application is a Continuation of PCT International Application No. PCT/JP2016/080599 filed on Oct. 14, 2016, which claims priority under 35 U.S.C. § 119(a) to Japanese Patent Application No. 2015-249499 filed on Dec. 22, 2015. The above application is hereby expressly incorporated by reference, in its entirety, into the present application.

BACKGROUND OF THE INVENTION

1. Field of the Invention

The present invention relates to a photocatalyst electrode that includes a photocatalyst layer and a co-catalyst and decomposes water with light to generate gas, and an artificial photosynthesis module using the photocatalyst electrode, and particularly, to a photocatalyst electrode and an artificial photosynthesis module in which the co-catalyst is provided in a region that does not hinder light incident on the photocatalyst layer.

2. Description of the Related Art

Nowadays, water is decomposed using a photocatalyst to obtain gases, such as hydrogen gas and oxygen gas. For example, as one of the forms in which solar light energy that is renewable energy is utilized, it is suggested that a photoelectric conversion material used for solar batteries is used and an electromotive force obtained with this photoelectric conversion material is utilized to decompose an electrolytic aqueous solution to produce oxygen and hydrogen (for example, refer to JP2012-46385A).

JP2012-46385A describes an electrode for optical water decomposition having a structure in which a p-type semiconductor, an n-type semiconductor, and a reaction co-catalyst are laminated in this order on a collector electrode. In JP2012-46385A, water can be decomposed to produce hydrogen by holding the electrode for optical water decomposition in water and radiating light, such as solar light.

SUMMARY OF THE INVENTION

Although the electrode for optical water decomposition of JP2012-46385A receives light, such as solar light, to decompose water to produce hydrogen, in the present situation, a further increase in the amount of gas generated, such as hydrogen, is desired, and improvement in reaction efficiency is desired. However, in JP2012-46385A, the reaction co-catalyst is laminated on the n-type semiconductor, a position where the reaction co-catalyst is provided is limited to the n-type semiconductor, and a reaction field is also limited. In JP2012-46385A, in order to increase the amount of gas generated, it is necessary to increase the area of the n-type semiconductor, and it is necessary to enlarge the electrode for optical water decomposition. In this case, it is difficult to make the reaction efficiency per installation area of the electrode for optical water decomposition high. Moreover, it is also required to stably generate gas, such as hydrogen, over a long period of time.

A first object of the invention is to solve the problems based on the aforementioned related art and provide a photocatalyst electrode and an artificial photosynthesis module with high reaction efficiency.

A second object of the invention is to provide a photocatalyst electrode and an artificial photosynthesis module capable of stably generating gas over a long period of time.

In order to achieve the above objects, a first aspect of the invention is a photocatalyst electrode that decomposes water with light to generate gas. The photocatalyst electrode comprises a laminate including a substrate, a conductive layer provided on a surface of the substrate, and a photocatalyst layer provided on a surface of the conductive layer; and a first co-catalyst electrically connected to the photocatalyst layer. The light is incident from the surface side of the photocatalyst layer of the laminate, and in a case where a region where the light is incident on the surface of the photocatalyst layer and above the surface is defined as a first region and the region other than the first region is defined as a second region, the first co-catalyst is provided at least in the second region. The first co-catalyst and the photocatalyst layer are electrically connected to each other by at least one of a transparent conductive layer provided on the surface of the photocatalyst layer, or a wiring line.

It is preferable that the second region is a region provided on a surface of the substrate opposite to the conductive layer and facing the surface. It is preferable that an installation area where the first co-catalyst is provided is one time or more and ten times or less with respect to an installation area where the photocatalyst layer is provided.

It is preferable that the first co-catalyst is formed of a co-catalyst film, a co-catalyst mesh material, a plurality of co-catalyst particles, or the plurality of co-catalyst particles carried and supported on a base material. It is preferable that the first co-catalyst has a plurality of the co-catalyst films that are electrically connected to each other. It is preferable that the first co-catalyst is the co-catalyst mesh material that is folded. Additionally, the gas generated in the photocatalyst electrode is, for example, hydrogen gas.

A second aspect of the invention provides an artificial photosynthesis module comprising the photocatalyst electrode of the first aspect of the invention.

According to the invention, the photocatalyst electrode and the artificial photosynthesis module with high reaction efficiency can be obtained. Additionally, the photocatalyst electrode and the artificial photosynthesis module capable of stably generating gas over a long period of time can be obtained.

DESCRIPTION OF THE PREFERRED EMBODIMENTS

Hereinafter, a photocatalyst electrode and an artificial photosynthesis module of the invention will be described in detail with reference to suitable embodiments illustrated in the attached drawings.

In addition, in the following, "to" showing a numerical range includes numerical values described on both sides thereof. For example, $\varepsilon$ being a numerical value $\alpha$ to a numerical value $\beta$ means that the range of $\varepsilon$ is a range including the numerical value $\alpha$ and the numerical value $\beta$, and in a case where these are expressed by mathematical symbols, $\alpha \leq \varepsilon \leq \beta$ is satisfied. Additionally, the "same" includes error ranges that are generally allowed in the technical field.

Figure 1:
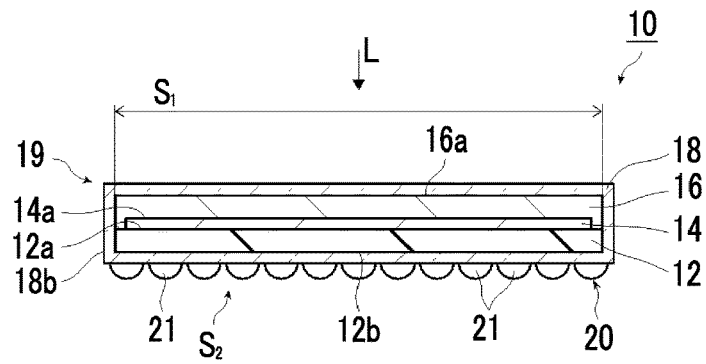
FIG. 1 is a schematic sectional view illustrating a first example of a photocatalyst electrode of an embodiment of the invention.
Figure 2:
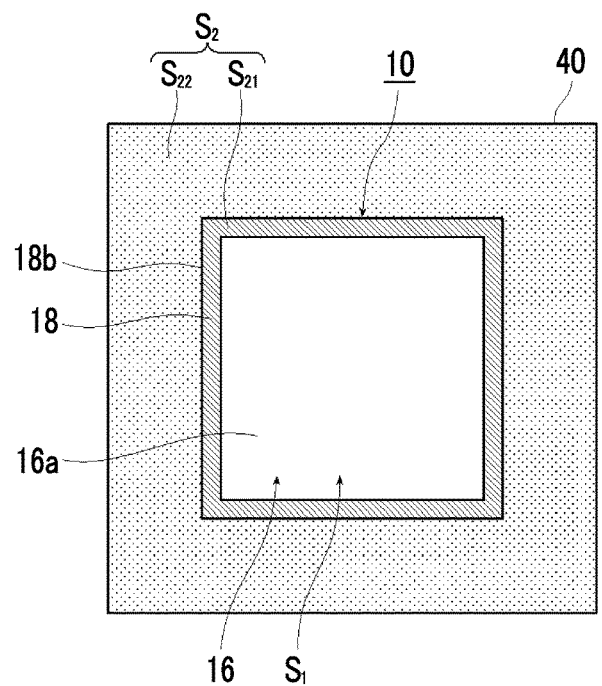
FIG. 2 is a schematic plan view illustrating the first example of the photocatalyst electrode of the embodiment of the invention.

FIG. 1 is a schematic sectional view illustrating a first example of a photocatalyst electrode of an embodiment of the invention, and FIG. 2 is a schematic plan view illustrating a first example of the photocatalyst electrode of the embodiment of the invention.

As illustrated in FIG. 1, a photocatalyst electrode 10 has a substrate 12, a conductive layer 14 provided on a surface 12a of the substrate 12, a photocatalyst layer 16 provided on a surface 14a of the conductive layer 14, and a transparent conductive layer 18 that covers the photocatalyst layer 16. A laminate 19 is constituted of the substrate 12, the conductive layer 14, the photocatalyst layer 16, and the transparent conductive layer 18. The photocatalyst electrode 10 has a first co-catalyst 20 electrically connected to the laminate 19. In addition, a configuration in which there is no transparent conductive layer 18 is also included in the laminate 19 as will be described below. By providing the transparent conductive layer 18, paths for the carriers generated in the photocatalyst layer 16 can be secured.

In the photocatalyst electrode 10, light L is incident on a surface 16a side of the photocatalyst layer 16. A region where the light L is incident on the surface 16a of the photocatalyst layer 16 and above the surface is defined as a first region $S_1$, and the region other than the first region $S_1$ is defined as a second region $S_2$. In the photocatalyst electrode 10, the first co-catalyst 20 is provided in the second region $S_2$. Specifically, the first co-catalyst 20 is provided on the transparent conductive layer 18 on a back face 12b side of the substrate 12 opposite to the transparent conductive layer 18. The first co-catalyst 20 is constituted of, for example, a plurality of co-catalyst particles 21. The plurality of co-catalyst particles 21 are electrically connected to each other in a case where no co-catalyst particles are formed on a conductor, such as the transparent conductive layer 18. In the photocatalyst electrode 10, the first co-catalyst 20 is provided integrally with the laminate 19.

In addition, a region on the back face 12b of the substrate 12 opposite to the transparent conductive layer 18 and a region facing the back face 12b are also the above-described second region $S_2$.

The substrate 12 supports the conductive layer 14, the photocatalyst layer 16, and the transparent conductive layer 18, and has an electrical insulating property. In addition, as the electrical insulating property, short-circuiting or the like is required not to occur in a case where the photocatalyst electrode 10 is used.

The carriers are generated in a case where the photocatalyst layer 16 is irradiated with the light L. The first co-catalyst 20 decomposes water based on the carriers generated in the photocatalyst layer 16 to generate gas.

The transparent conductive layer 18 electrically connects the photocatalyst layer 16 and the first co-catalyst 20 to each other. Here, the term "transparent" means that the light transmittance is at least 60% or more, preferably 80% or more, more preferably 90% or more, and still more preferably 95%, in a light-receiving wavelength range of the photocatalyst layer 16.

The substrate 12, the conductive layer 14, the photocatalyst layer 16, the transparent conductive layer 18, and the first co-catalyst 20 will be described below in detail.

In the photocatalyst electrode 10, in a case where the light L is incident on the photocatalyst layer 16 in a water-immersed state, the carriers are generated, and water is decomposed by the first co-catalyst 20 to generate gas. The first co-catalyst 20 functions as a reaction field. Here, the carriers are, for example, electrons and positive holes.

The photocatalyst layer 16 generates more carriers as the optical absorption efficiency with respect to the light L is higher. In a case where the amount of the first co-catalyst 20 is small, for example, in a case where the installation area of the first co-catalyst 20 is small even though many carriers are generated, the reaction field is small, and the generated carriers become useless. In the photocatalyst electrode 10, by using the second region $S_2$ without providing the first co-catalyst 20 on the surface 16a of the photocatalyst layer 16, the installation area of the first co-catalyst 20 can be increased, and the amount of the first co-catalyst 20 can be increased. Accordingly, the reaction field can be increased, the generated carriers can be effectively used, and the reaction efficiency of decomposition of water can be made high. The reaction efficiency of decomposition of water can be evaluated, for example, by current density showing water decomposition, and the current density being high means that the reaction efficiency is high.

Additionally, by providing the first co-catalyst 20 in the second region $S_2$, the degrees of freedom of the arrangement position and arrangement area of the first co-catalyst 20 can be made high. Moreover, by changing the arrangement position, desorption of the co-catalyst particles 21 of the first co-catalyst 20 can be suppressed, and the durability can also be improved. Additionally, in a case where the gas generated on the photocatalyst layer 16 stagnates in the form of air bubbles, the incidence of the light L onto the photocatalyst layer 16 is hindered, and the generation of the carriers decreases. However, since no co-catalyst is provided on the photocatalyst layer 16, a decrease in the generation of the carriers is suppressed. Moreover, since no co-catalyst is provided on the photocatalyst layer 16, the incidence of the light L onto the photocatalyst layer 16 is not hindered, and the utilization efficiency of the light L can be made high.

In addition, water also includes an electrolytic aqueous solution AQ. Here, the electrolytic aqueous solution AQ is a liquid having $H_2O$ as a main component, may be an aqueous solution having water as a solvent and including a solute, and is, for example, an electrolyte including an electrolytic solution including strong alkali (KOH (potassium hydroxide)) and 0.1 M of $H_2SO_4$, a 0.1 M sodium sulfate electrolytic solution, a 0.1 M potassium phosphate buffer solution, or the like. The water may be distilled water, or cooling water to be used in a cooling tower.

A position where the first co-catalyst 20 is provided is not particularly limited so as long the position is within the second region $S_2$. As illustrated in FIG. 2, a region $S_{21}$ formed by the transparent conductive layer 18 being larger than the photocatalyst layer 16, and a region $S_{22}$ of a container 40 and the photocatalyst electrode 10, which is formed in a case where the photocatalyst electrode 10 is disposed in the container 40, is the second region $S_2$. The first co-catalyst 20 may be provided in the region $S_{21}$ and the region $S_{22}$. Moreover, the first co-catalyst 20 is provided on a side surface 18b of the transparent conductive layer 18.

The photocatalyst electrode 10 is not limited to the configuration illustrated in FIG. 1. Next, other examples of the photocatalyst electrode 10 will be described.

Figure 3:
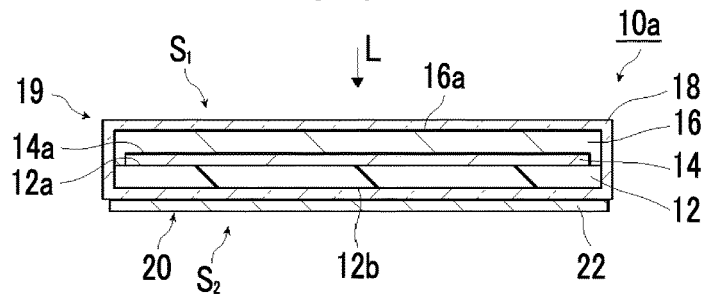
FIG. 3 is a schematic sectional view illustrating a second example of the photocatalyst electrode of the embodiment of the invention.
Figure 4:
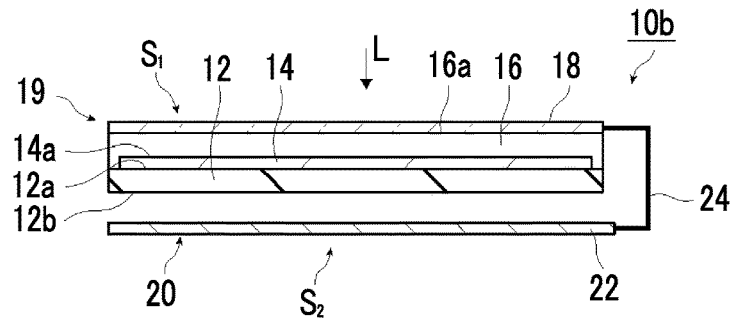
FIG. 4 is a schematic sectional view illustrating a third example of the photocatalyst electrode of the embodiment of the invention.
Figure 5:
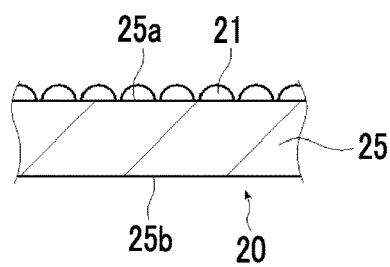
FIG. 5 is a schematic sectional view illustrating an example of the configuration of a first co-catalyst of the photocatalyst electrode.

FIG. 3 is a schematic sectional view illustrating a second example of the photocatalyst electrode of the embodiment of the invention, FIG. 4 is a schematic sectional view illustrating a third example of the photocatalyst electrode of the embodiment of the invention, and FIG. 5 is a schematic sectional view illustrating an example of the configuration of a first co-catalyst of the photocatalyst electrode.

In FIGS. 3 and 4, the same components as those of the photocatalyst electrode 10 illustrated in FIGS. 1 and 2 will be designated by the same reference signs, and the detailed description thereof will be omitted.

In a photocatalyst electrode 10a illustrated in FIG. 3, the first co-catalyst 20 is constituted of a co-catalyst film 22 provided on the transparent conductive layer 18 on the back face 12b side of the substrate 12, instead of the plurality of co-catalyst particles 21 (refer to FIG. 1). The co-catalyst film 22 exhibits the same function as the co-catalyst particles 21, and the co-catalyst particles 21 and the co-catalyst film 22 may have the same composition. In addition, the co-catalyst film 22 is in the form of a uniform film, and has a form referred to a solid film. Since configuration other than the above-described configuration is the same as that of the photocatalyst electrode 10 illustrated in FIG. 1, the detailed description thereof will be omitted.

Also in the configuration in which the co-catalyst film 22 of the photocatalyst electrode 10a is provided, the same effects as those of the photocatalyst electrode 10 illustrated in FIG. 1 can be obtained.

In a photocatalyst electrode 10b illustrated in FIG. 4, the first co-catalyst 20 is constituted of the co-catalyst film 22, instead of the plurality of co-catalyst particles 21 (refer to FIG. 1).

The co-catalyst film 22 is the same as that in the above-described FIG. 3. In the photocatalyst electrode 10b, the co-catalyst film 22 is provided separately from the laminate 19. The co-catalyst film 22 is disposed in a region that faces the back face 12b of the substrate 12 opposite to the transparent conductive layer 18. The co-catalyst film 22 and the transparent conductive layer 18 are electrically connected to each other with a wiring line 24. Since the co-catalyst film 22 is electrically connected using the wiring line 24, it is not necessary to cover the photocatalyst layer 16 and to provide the transparent conductive layer 18 up to the back face 12b of the substrate 12. Since configuration other than the above-described configuration is the same as that of the photocatalyst electrode 10 illustrated in FIG. 1, the detailed description thereof will be omitted.

In this way, even by providing the co-catalyst film 22 separately from the laminate 19 using the wiring line 24, the same effects as those of the photocatalyst electrode 10 illustrated in FIG. 1 can be obtained.

The composition of the wiring line 24 is not particularly limited in a case where the wiring line 24 has conductivity. Additionally, the form of the wiring line 24 may be linear or beltlike, and is not particularly limited. The wiring line 24 can be connected using, for using, solder or conductive paste.

Although both of the co-catalyst film 22 of the photocatalyst electrode 10a of FIG. 3 and the co-catalyst film 22 of the photocatalyst electrode 10b of FIG. 4 are solid films, instead of this, the configuration in which the co-catalyst particles 21 are provided on a surface 25a of a flat plate-shaped base material 25 as it replaced with this and was illustrated in FIG. 5 may be the first co-catalyst 20. The co-catalyst particles 21 may be provided on at least one of the surface 25a and a back face 25b of the base material 25.

The base material 25 has conductivity, similar to the wiring line 24. The carriers generated in the photocatalyst layer 16 reach the co-catalyst particles 21 through the wiring line 24 and the base material 25, and water is decomposed.

The base material 25 is not limited to a flat plate-shaped one, and may be meshed or porous and may be a three-dimensional structure in addition to the flat plate-shaped two-dimensional structure. As the three-dimensional structure, a meshed three-dimensional structure may be configured, or a woven three-dimensional structure may be configured.

Figure 6:
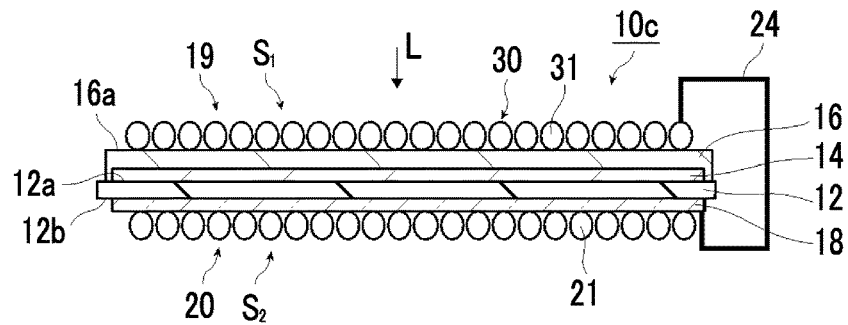
FIG. 6 is a schematic sectional view illustrating a fourth example of the photocatalyst electrode of the embodiment of the invention.
Figure 7:
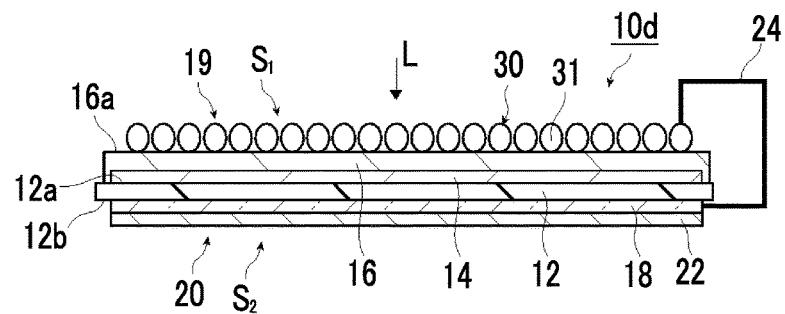
FIG. 7 is a schematic sectional view illustrating a fifth example of the photocatalyst electrode of the embodiment of the invention.
Figure 8:
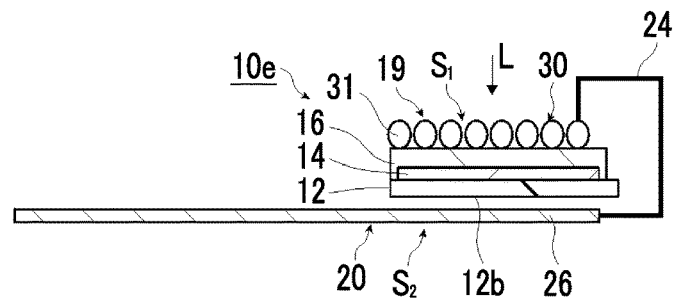
FIG. 8 is a schematic sectional view illustrating a sixth example of the photocatalyst electrode of the embodiment of the invention.

FIG. 6 is a schematic sectional view illustrating a fourth example of the photocatalyst electrode of the embodiment of the invention, FIG. 7 is a schematic sectional view illustrating a fifth example of the photocatalyst electrode of the embodiment of the invention, and FIG. 8 is a schematic sectional view illustrating a sixth example of the photocatalyst electrode of the embodiment of the invention.

In FIGS. 6 to 8, the same components as those of the photocatalyst electrode 10 illustrated in FIGS. 1 and 2 will be designated by the same reference signs, and the detailed description thereof will be omitted.

In a photocatalyst electrode 10c illustrated in FIG. 6, a second co-catalyst 30 is provided on the surface 16a of the photocatalyst layer 16, that is, in the first region $S_1$. The second co-catalyst 30 is constituted of a plurality of, for example, co-catalyst particles 31 in order to suppress a decrease in the amount of the light L incident onto the surface 16a of the photocatalyst layer 16. The co-catalyst particles 31 are the same as the co-catalyst particles 21. Similar to the co-catalyst particles 21, the plurality of co-catalyst particles 31 are electrically connected to each other in a case where no co-catalyst particles are formed on a conductor, such as the transparent conductive layer 18. Since configuration other than the above-described configuration is the same as that of the photocatalyst electrode 10 illustrated in FIG. 1, the detailed description thereof will be omitted.

As in the photocatalyst electrode 10c, also in the configuration in which the second co-catalyst 30 is provided in the first region $S_1$ in addition to the first co-catalyst 20, the reaction efficiency of decomposition of water can be made high by providing the first co-catalyst 20.

Although a configuration in which the transparent conductive layer 18 is provided on the back face 12b of the substrate 12 is adopted, the invention is not limited to this, and it is not necessary to make the light L transmitted through the back face 12b side of the substrate 12. Therefore, a conductive film having lower transmittance than the transparent conductive layer 18 may be adopted.

In a photocatalyst electrode 10d illustrated in FIG. 7, the second co-catalyst 30 is provided on the surface 16a of the photocatalyst layer 16, that is, in the first region $S_1$. The second co-catalyst 30 is the same as the above-described photocatalyst electrode 10c.

The first co-catalyst 20 is constituted of the co-catalyst film 22. The co-catalyst film 22 is the same as the photocatalyst electrode 10a in the above-described FIG. 3. In addition, instead of the co-catalyst film 22, a co-catalyst mesh material 26 (refer to FIG. 8) to be described below may be provided.

As in the photocatalyst electrode 10d, also in the configuration in which the second co-catalyst 30 is provided in the first region $S_1$ in addition to the first co-catalyst 20, the reaction efficiency of decomposition of water can be made high by providing the first co-catalyst 20.

In a photocatalyst electrode 10e illustrated in FIG. 8, the second co-catalyst 30 is provided on the surface 16a of the photocatalyst layer 16, that is, in the first region $S_1$. The second co-catalyst 30 is the same as the above-described photocatalyst electrode 10c.

The first co-catalyst 20 is formed of the co-catalyst mesh material 26. The co-catalyst mesh material 26 is disposed in the region that faces the back face 12b of the substrate 12 opposite to the transparent conductive layer 18.

For example, the co-catalyst mesh material 26 is configured with the same composition as that of the co-catalyst particles 21. The shape of openings and the size of the openings in the co-catalyst mesh material 26 are not particularly limited. Additionally, the co-catalyst mesh material 26 may be, for example, one in which co-catalyst particles are carried and supported on a meshed or porous base material.

As in the photocatalyst electrode 10e, also in the configuration in which the second co-catalyst 30 is provided in the first region $S_1$ in addition to the first co-catalyst 20, the reaction efficiency of decomposition of water can be made high by providing the first co-catalyst 20.

Additionally, in a case where areas are the same, the co-catalyst mesh material 26 can be made to have a greater surface area than the co-catalyst film 22, and the contact area, that is, reaction area of the co-catalyst mesh material 26 with the electrolytic aqueous solution AQ can be increased. Therefore, the installation area of the first co-catalyst 20 can be made small without increasing the area of the co-catalyst mesh material 26. Additionally, since the co-catalyst mesh material 26 can be made to have a greater surface area per unit area than the co-catalyst film 22, the reaction efficiency per installation area can be made high. Accordingly, the reaction efficiency of decomposition of water can be made higher.

Figure 9:
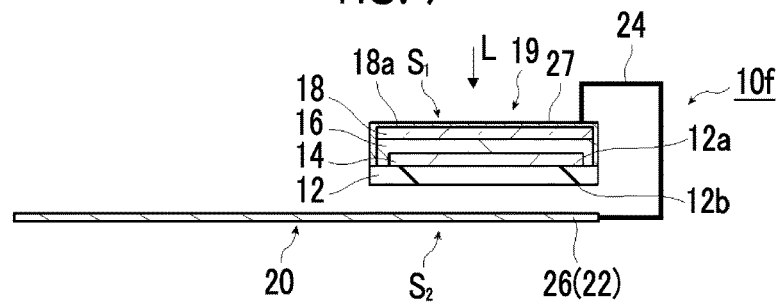
FIG. 9 is a schematic sectional view illustrating a seventh example of the photocatalyst electrode of the embodiment of the invention.
Figure 10:
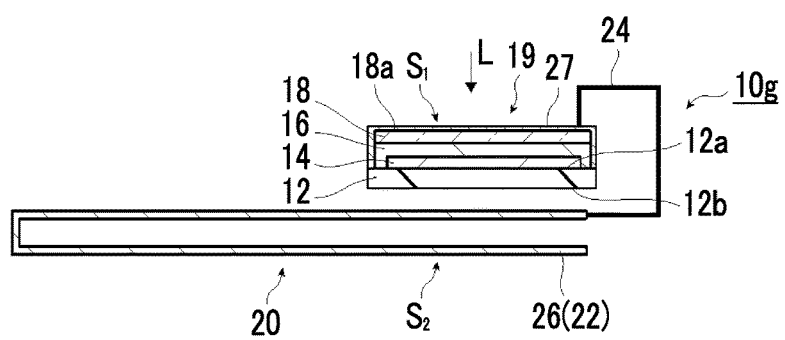
FIG. 10 is a schematic sectional view illustrating an eighth example of the photocatalyst electrode of the embodiment of the invention.
Figure 11:
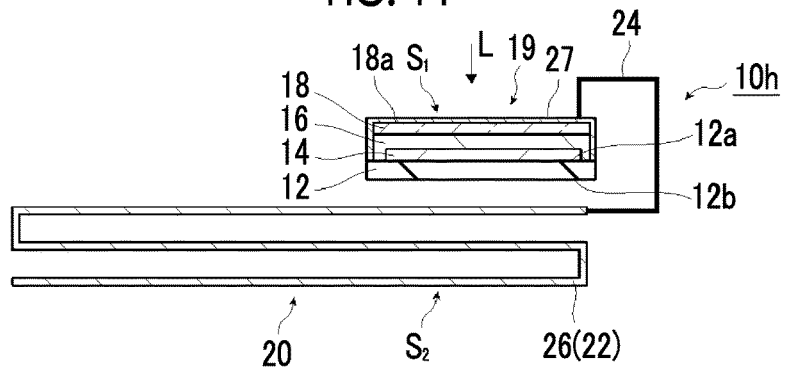
FIG. 11 is a schematic sectional view illustrating a ninth example of the photocatalyst electrode of the embodiment of the invention.

FIG. 9 is a schematic sectional view illustrating a seventh example of the photocatalyst electrode of the embodiment of the invention, FIG. 10 is a schematic sectional view illustrating an eighth example of the photocatalyst electrode of the embodiment of the invention, and FIG. 11 is a schematic sectional view illustrating a ninth example of the photocatalyst electrode of the embodiment of the invention.

In FIGS. 9 to 11, the same components as those of the photocatalyst electrode 10 illustrated in FIGS. 1 and 2 will be designated by the same reference signs, and the detailed description thereof will be omitted.

In a photocatalyst electrode 10f illustrated in FIG. 9, the first co-catalyst 20 is formed of the co-catalyst mesh material 26. The co-catalyst mesh material 26 is disposed in the region that faces the back face 12b of the substrate 12 opposite to the transparent conductive layer 18. The co-catalyst mesh material 26 is the same as that of the photocatalyst electrode 10e of the above-described FIG. 8.

A protective film 27 protects the transparent conductive layer 18, is configured to match the absorption wavelength of the photocatalyst layer 16. For example, oxides, such as $TiO_2$, $ZrO_2$, and $Ga_2O_3$, are used for the protective film 27. In a case where the protective film 27 is an insulator, for example, the thickness thereof is 5 to 50 nm, and film formation methods, such as an atomic layer deposition (ALD) method, are selected. In a case where the protective film 27 is conductive, for example, the protective film 27 has a thickness of 5 to 500 nm, and may be formed by a sputtering method and the like in addition to the atomic layer deposition (ALD) method and a chemical vapor deposition (CVD) method. The protective film 27 can be made thicker in a case where the protective film is a conductor than in a case where the protective film is insulating.

Even though the co-catalyst mesh material 26 is provided using the wiring line 24 as in the photocatalyst electrode 10f, the same effects as those of the photocatalyst electrode 10 illustrated in FIG. 1 can also be obtained.

Since a photocatalyst electrode 10g illustrated in FIG. 10 and a photocatalyst electrode 10h illustrated in FIG. 11 are the same as the photocatalyst electrode 10f of FIG. 9 except for a configuration in which the co-catalyst mesh material 26 is folded, the detailed description thereof will be omitted. In the photocatalyst electrode 10g illustrated in FIG. 10, the area of the co-catalyst mesh material 26 is twice greater than the photocatalyst electrode 10f of FIG. 9, and in the photocatalyst electrode 10h illustrated in FIG. 11, the area of the co-catalyst mesh material 26 is three times greater than the photocatalyst electrode 10f of FIG. 9.

By increasing the number of times of folding using the co-catalyst mesh material 26 in this way, the installation area of the first co-catalyst 20 can be easily changed, and the design degree of freedom of the photocatalyst electrode can be made high. In the co-catalyst mesh material 26, light L is incident from a surface 16a side of the photocatalyst layer 16.

In addition, the number of times of folding of the co-catalyst mesh material 26 is appropriately determined depending on the area of the co-catalyst mesh material 26, the size of an installation location, or the like.

Although the co-catalyst mesh material 26 is used in FIGS. 9 to 11, the co-catalyst film 22 may be used instead of this. In this case, in the configurations of FIGS. 10 and 11, a plurality of the co-catalyst films 22 are electrically connected to each other with the wiring line 24, and are disposed on the back face 12b side of the substrate 12. Moreover, in FIGS. 9 to 11, the base material 25 provided with the above-described co-catalyst particles 21 may be used instead of the co-catalyst film 22.

Figure 12:
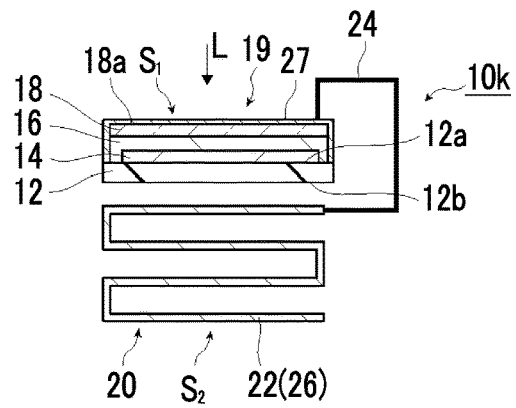
FIG. 12 is a schematic sectional view illustrating a tenth example of the photocatalyst electrode of the embodiment of the invention.

Additionally, as in a photocatalyst electrode 10k illustrated in FIG. 12, a configuration in which the co-catalyst film 22 or the co-catalyst mesh material 26 is disposed so as not to overflow from the back face 12b of the substrate 12 may also be adopted. In this case, since the first co-catalyst 20 does not overflow from the substrate 12 as the photocatalyst electrode 10k is seen from the surface 16a of the photocatalyst layer 16, the area of the first co-catalyst 20 can be secured, and the installation area of the photocatalyst electrode 10k can be made small. As a result, the reaction efficiency per installation area of the photocatalyst electrode 10k can be made high.

In addition, FIG. 12 is a schematic sectional view illustrating the tenth example of the photocatalyst electrode of the embodiment of the invention.

Figure 13:
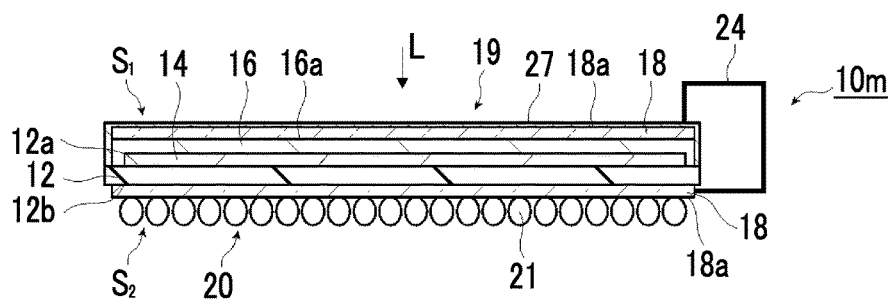
FIG. 13 is a schematic sectional view illustrating an eleventh example of the photocatalyst electrode of the embodiment of the invention.
Figure 14:
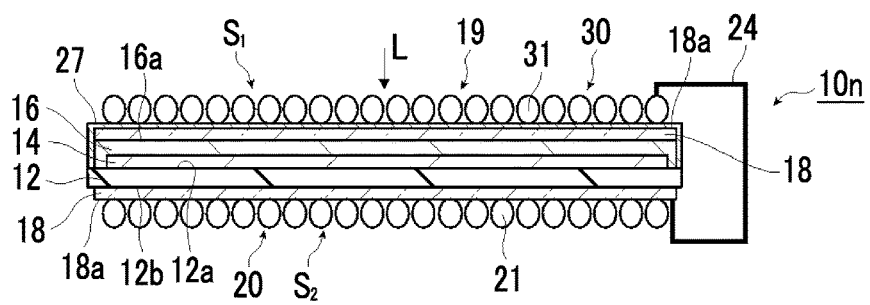
FIG. 14 is a schematic sectional view illustrating a twelfth example of the photocatalyst electrode of the embodiment of the invention.
Figure 15:
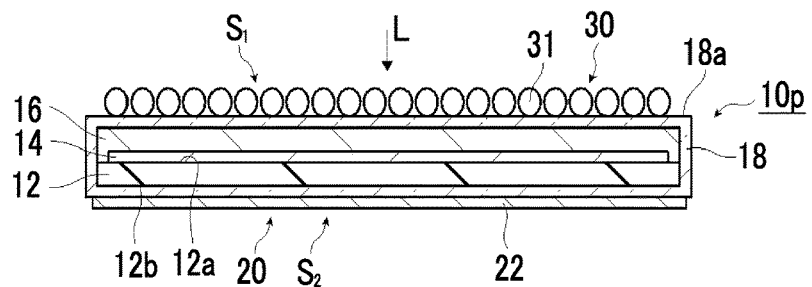
FIG. 15 is a schematic sectional view illustrating a thirteenth example of the photocatalyst electrode of the embodiment of the invention.

FIG. 13 is a schematic sectional view illustrating an eleventh example of the photocatalyst electrode of the embodiment of the invention, FIG. 14 is a schematic sectional view illustrating a twelfth example of the photocatalyst electrode of the embodiment of the invention, and FIG. 15 is a schematic sectional view illustrating a thirteenth example of the photocatalyst electrode of the embodiment of the invention.

In FIGS. 13 to 15, the same components as those of the photocatalyst electrode 10 illustrated in FIGS. 1 and 2 will be designated by the same reference signs, and the detailed description thereof will be omitted.

In a photocatalyst electrode 10m illustrated in FIG. 13, the transparent conductive layers 18 are provided only on the surface 16a of the photocatalyst layer 16 and the back face 12b of the substrate 12, and the protective film 27 that covers a surface 18a of the transparent conductive layer 18 on the surface 16a of the photocatalyst layer 16 is provided. Additionally, the transparent conductive layer 18 on the surface 16a of the photocatalyst layer 16 and the transparent conductive layer 18 on the back face 12b of the substrate 12 are electrically connected to each other with the wiring line 24. Since configuration other than the above-described configuration is the same as that of the photocatalyst electrode 10 illustrated in FIG. 1, the detailed description thereof will be omitted.

In addition, the protective film 27 is the same as the protective film 27 of the photocatalyst electrode 10f illustrated in the above-described FIG. 9.

By electrically connecting the transparent conductive layer 18 on the surface 16a of the photocatalyst layer 16 and the transparent conductive layer 18 on the back face 12b of the substrate 12 to each other with the wiring line 24 as in the photocatalyst electrode 10m illustrated in FIG. 13, it is not necessary to provide the transparent conductive layer 18 covering the photocatalyst layer 16 up to the back face 12b of the substrate 12.

In a photocatalyst electrode 10n illustrated in FIG. 14, the second co-catalyst 30 is provided on the surface 18a of the transparent conductive layer 18 on the surface 16a of the photocatalyst layer 16. Since configuration other than the above-described configuration is the same as that of the photocatalyst electrode 10m illustrated in FIG. 13, the detailed description thereof will be omitted.

The second co-catalyst 30 is constituted of, for example, the plurality of co-catalyst particles 31. The co-catalyst particles 31 are the same as the co-catalyst particles 21.

In a photocatalyst electrode 10p illustrated in FIG. 15, the second co-catalyst 30 is provided on the surface 18a of the transparent conductive layer 18, and the co-catalyst film 22 is provided as the first co-catalyst 20 on the transparent conductive layer 18 on the back face 12b side of the substrate 12 opposite to the transparent conductive layer 18. Since configuration other than the above-described configuration is the same as that of the photocatalyst electrode 10 illustrated in FIG. 1, the detailed description thereof will be omitted.

As in the photocatalyst electrode 10p, also in the configuration in which the second co-catalyst 30 is provided in the first region $S_1$ in addition to the first co-catalyst 20, the reaction efficiency of decomposition of water can be made high by providing the first co-catalyst 20. In addition, instead of the co-catalyst film 22, the co-catalyst mesh material 26 (refer to FIG. 8) may be provided.

Figure 16:
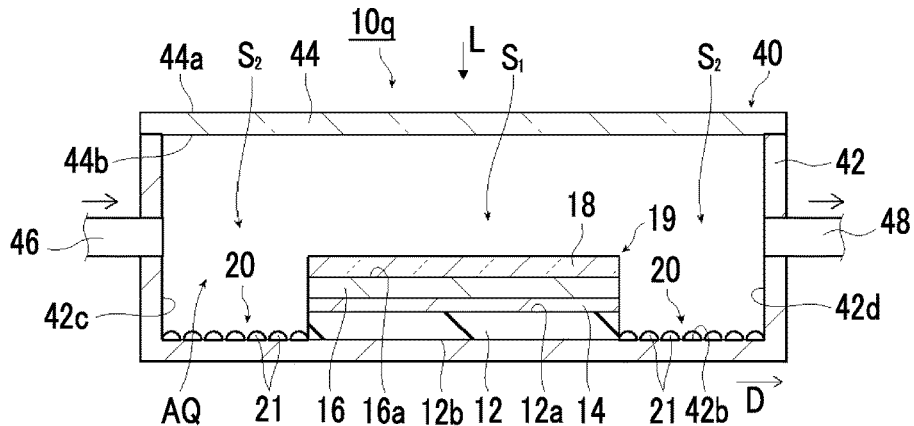
FIG. 16 is a schematic sectional view illustrating a fourteenth example of the photocatalyst electrode of the embodiment of the invention.
Figure 17:
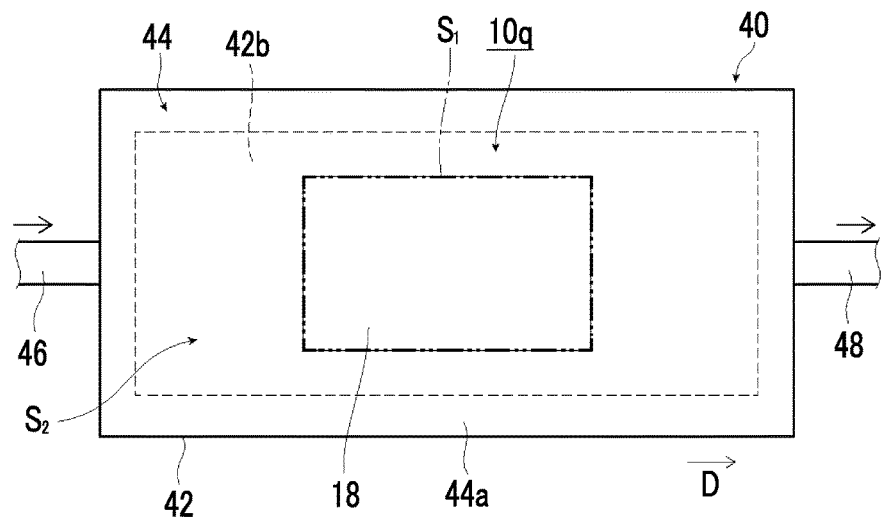
FIG. 17 is a schematic plan view illustrating the fourteenth example of the photocatalyst electrode of the embodiment of the invention.

FIG. 16 is a schematic sectional view illustrating a fourteenth example of the photocatalyst electrode of the embodiment of the invention, and FIG. 17 is a schematic plan view illustrating a fourteenth example of the photocatalyst electrode of the embodiment of the invention.

In FIGS. 16 and 17, the same components as those of the photocatalyst electrode 10 illustrated in FIGS. 1 and 2 will be designated by the same reference signs, and the detailed description thereof will be omitted.

A photocatalyst electrode 10q illustrated in FIGS. 16 and 17 is disposed within the container 40. The container 40 has a housing 42 of which one face is open, and a transparent member 44 that covers the open portion of the housing 42. The photocatalyst electrode 10q is disposed on a bottom surface 42b of the housing 42 such that the transparent conductive layer 18 is directed to the transparent member 44. The region on the surface 18a of the transparent conductive layer 18 of the photocatalyst electrode 10q and above the surface becomes the first region $S_1$, and the region other than first region $S_1$ becomes the second region $S_2$ (refer to FIG. 17) within the container 40. In addition, the light L is incident from a surface 44a side of the transparent member 44 of the container 40.

As the first co-catalyst 20, the plurality of co-catalyst particles 21 are provided around the transparent conductive layer 18 on the bottom surface 42b of the housing 42. The transparent conductive layer 18 and the co-catalyst particles 21 are electrically connected to each other. In the photocatalyst electrode 10q, the protective film 27 that covers the surface 18a of the transparent conductive layer 18 may be provided.

In the housing 42, a supply pipe 46 is provided in a first wall surface 42c, and a discharge pipe 48 is provided in a second wall surface 42d that faces the first wall surface 42c. The above-described electrolytic aqueous solution AQ is supplied into the container 40 from the supply pipe 46, the inside of the container 40 is filled with the electrolytic aqueous solution AQ, the electrolytic aqueous solution AQ flows in a direction D, and the electrolytic aqueous solution AQ is discharged from the discharge pipe 48. The direction D is a direction from the first wall surface 42c toward the second wall surface 42d. In addition, the housing 42 is formed of, for example, electrical insulating materials that do not cause short circuiting or the like in a case where the photocatalyst electrode 10q is used. The housing 42 is formed of, for example, acrylic resin.

The first co-catalyst 20 is not limited to the plurality of co-catalyst particles 21, and any of the above-described co-catalyst film 22 (refer to FIG. 3), the base material 25 (refer to FIG. 5) provided with the above-described co-catalyst particles 21, and the above-described co-catalyst mesh material 26 (refer to FIG. 8) may be adopted.

Additionally, in the photocatalyst electrode 10q a configuration in which the first co-catalyst 20 is provided on the bottom surface 42b of the housing 42 is adopted. However, the invention is not be limited to this, and any of the first wall surface 42c and the second wall surface 42d may be adopted. The position where the first co-catalyst 20 is provided is appropriately determined in accordance with the usage pattern of the photocatalyst electrode 10q, the installation area of the first co-catalyst 20, or the like.

The first co-catalyst 20 can be disposed within the container 40 in this way. Therefore, for example, by disposing the first co-catalyst 20 at a position where the flow of the electrolytic aqueous solution AQ is weak, peeling or the like of the first co-catalyst 20 can be suppressed, the durability can be improved, and the design degree of freedom also increases further. Additionally, since the first co-catalyst 20 can be provided separately from the laminate 19, the configuration of the photocatalyst electrode itself can be simplified.

Although the photocatalyst electrode has been described as above, in any of the photocatalyst electrodes, the installation area where the first co-catalyst 20 is provided is preferably more than 1 time and 10 times or less, and more preferably 3 times or more and 6 times or less with respect to the installation area where the photocatalyst layer 16 is provided. Higher reaction efficiency can be obtained in a case where the installation area in which the first co-catalyst 20 is provided is more than 1 time and 10 times or less with respect to the installation area where the photocatalyst layer 16 is provided.

Here, the installation area where the first co-catalyst 20 is provided is the area of a member provided with the first co-catalyst 20. The area of a flat plate is the installation area in a case where the first co-catalyst 20 is provided on the flat plate. In the installation area of the invention, a difference in structure among the meshed shape, the porous shape, and the like is not taken into consideration. In a case where flat plates having the same size are provided, the installation areas are the same in any of the meshed shape and the porous shape.

Specifically, as illustrated in the above-described FIG. 5, in a case where the co-catalyst particles 21 are carried and supported on the base material 25, the maximum area of a region constituted of the carried and supported co-catalyst particles 21 is set as the installation area where the first co-catalyst 20 is provided. The maximum area of the region constituted of co-catalyst particles 21 represents the area of a region formed by joining the respective co-catalyst particles 21 at an outer edge of an assembly of the plurality of co-catalyst particles 21 together. The outer edge of the assembly of the plurality of co-catalyst particles 21 described above may be found from an image acquired using a scanning electron microscope (SEM). In a case where the co-catalyst particles 21 are provided on both surfaces of the base material 25, the total area of both the surfaces is set as the installation area where the first co-catalyst 20 is provided.

Additionally, even in a case where the co-catalyst particles 21 are carried and supported on a three-dimensional structure, the greatest region where the co-catalyst particles 21 are carried and supported is found, and the area of this greatest region is set as the installation area where the first co-catalyst 20 is provided. The above-described greatest region can be found from an image of the plurality of co-catalyst particles 21 acquired using the scanning electron microscope (SEM).

The installation area where the photocatalyst layer 16 is provided is the area of a range in which the light L incident on the surface 16a of the photocatalyst layer 16 actually hits. In a case where the light L is incident perpendicular to the surface 16a of the photocatalyst layer 16, the area of the entire region of the surface 16a of the photocatalyst layer 16 becomes the installation area where the photocatalyst layer 16 is provided, and in a case where the light L is incident at a certain angle, the area of the range in which the light L actually hits as described above becomes the installation area where the photocatalyst layer 16 is provided.

Any of that above-described photocatalyst electrodes is available for generation of hydrogen gas and generation of oxygen gas, and are also available for generation of methane in addition to this.

Hereinafter, the first co-catalyst 20 and the second co-catalyst 30 will be described. The first co-catalyst 20 and the second co-catalyst 30 are appropriately selected depending on the gas to be generated.

As the first co-catalyst 20 and the second co-catalyst 30, it is preferable to use any one of metals of groups 2 to 14, intermetallic compounds of these metals, or alloys; oxides, complex oxides, nitrides, oxynitrides, sulfides, or acid sulfides thereof; or mixtures thereof. Here, the "intermetallic compounds" are compounds formed of two or more kinds of metallic elements, and means that component atom ratios constituting the intermetallic compounds are not necessarily stoichiometric ratios and have wide composition ranges. The "oxides, complex oxides, nitrides, oxynitrides, sulfides, or acid sulfides thereof" mean oxides, complex oxides, nitrides, oxynitrides, sulfides, or acid sulfides of the metals of groups 2 to 14, the intermetallic compounds of these metals, or the alloys. The "mixtures thereof" means any two or more kinds of mixtures of the compounds exemplified above.

As the co-catalysts, noble metals and transition metal oxides are used. The co-catalysts are carried and supported using a vacuum vapor deposition method, a sputtering method, an electrodeposition method, or the like. In a case where the co-catalysts are formed with a set film thickness of, for example, about 1 to 5 nm, the co-catalysts are not formed as films but become island-like.

The co-catalysts include metals of Ti, Mn, Fe, Co, Ni, Cu, Ru, Rh, Pd, Ag, In, Ta, W, Ir, and Pt, or oxides or complex oxides thereof, more preferably metals of Mn, Co, Ni, Ru, Rh, and Ir, or oxides or complex oxide thereof, and still more preferably, Ir, MnO, $MnO_2$, $Mn_2O_3$, $Mn_3O_4$, FeOx, CoOx such as CoO, $Co_3O_4$, NiOx, $NiCo_2O_4$, $RuO_2$, $Rh_2O_3$, and $IrO_2$.

Although the carried and supported amounts of the co-catalysts are not limited, for example, the amounts are 0.01% to 10% by mass with an optical semiconductor (100% by mass) as a reference.

Among instances of the above-described co-catalysts, it is preferable that, for example, Pt, Pd, Ni, Ag, Ru, Cu, Co, Rh, Ir, Mn, and $RuO_2$ are used for generation of hydrogen gas. For example, it is preferable that $IrO_2$ is used for generation of oxygen gas. Additionally, for example, Cu is used for generation of methane.

Next, an artificial photosynthesis module using the photocatalyst electrode of the invention will be described.

Figure 18:
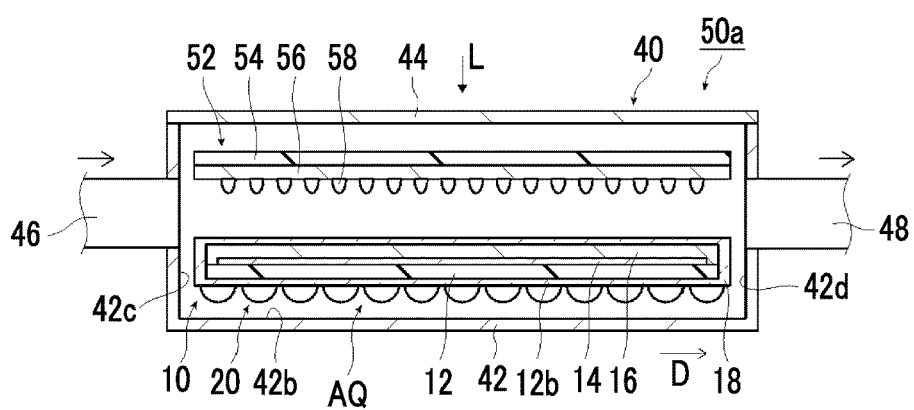
FIG. 18 is a schematic sectional view illustrating a first example of an artificial photosynthesis module of the embodiment of the invention.
Figure 19:
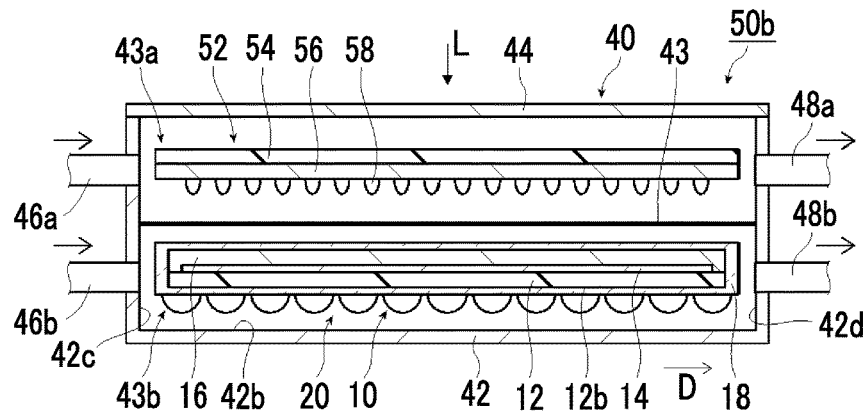
FIG. 19 is a schematic sectional view illustrating a second example of the artificial photosynthesis module of the embodiment of the invention.

Here, FIG. 18 is a schematic sectional view illustrating a first example of the artificial photosynthesis module of the embodiment of the invention, and FIG. 19 is a schematic sectional view illustrating a second example of the artificial photosynthesis module of the embodiment of the invention.

In FIGS. 18 and 19, the same components as those of the photocatalyst electrode 10 illustrated in FIGS. 1 and 2 will be designated by the same reference signs, and the detailed description thereof will be omitted.

An artificial photosynthesis module 50a illustrated in FIG. 18 decomposes the electrolytic aqueous solution AQ with light to generate hydrogen and oxygen. In the artificial photosynthesis module 50a, the photocatalyst electrode 10 and an oxygen-generating photocatalyst electrode 52 are provided to face each other with the photocatalyst electrode 10 being the bottom surface 42b side within the container 40. The photocatalyst electrode 10 functions as a hydrogen-generating photocatalyst electrode. The photocatalyst electrode 10 and the photocatalyst electrode 52 are electrically connected to each other. By adopting this configuration, the electrolytic aqueous solution AQ can be decomposed without applying a voltage or the like from the outside. The container 40 is the same as the container 40 illustrated in the above-described FIGS. 16 and 17.

In the oxygen-generating photocatalyst electrode 52, a substrate 54, a photocatalyst layer 56, and a co-catalyst 58 are laminated in this order. The photocatalyst electrode 52 is disposed such that the co-catalyst 58 is directed to the photocatalyst electrode 10.

The oxygen-generating photocatalyst electrode 52 allows the light L to be transmitted therethrough in order to make the light L incident on the photocatalyst electrode 10. All the substrate 54, the photocatalyst layer 56, and the co-catalyst 58 are configured to allow the light L to be transmitted therethrough. The transmittance of the light L of the photocatalyst electrode 52 is, for example, 60% or more and preferably 70% or more outside an oxygen-generation-side absorption range in a visible light region. The above-described transmittance is measured by a spectrophotometer.

In the artificial photosynthesis module 50a, by supplying the electrolytic aqueous solution AQ into the container 40 via the supply pipe 46 and making the light L incident from the transparent member 44 side, oxygen gas is generated from the photocatalyst electrode 52, and hydrogen gas is generated from the photocatalyst electrode 10. Then, the electrolytic aqueous solution AQ including the hydrogen gas and the oxygen gas is discharged from the discharge pipe 48, and the hydrogen gas and the oxygen gas are recovered from the discharged electrolytic aqueous solution AQ including the hydrogen gas and the oxygen gas.

In the photocatalyst electrode 10, the first co-catalyst 20 is provided on the back face 12b side of the substrate 12 as described above, and is not disposed in the first region $S_1$, onto which the light L is incident, on the surface 16a of the photocatalyst layer 16. Accordingly, the reaction efficiency can be made high without increasing the installation area of the photocatalyst electrode 10.

Additionally, since the first co-catalyst 20 does not hinder the incidence of the light L onto the surface 16a of the photocatalyst layer 16, the influence exerted on the reaction efficiency is small even in a case where generated gas stagnates in the form of air bubbles. Additionally, since the first co-catalyst 20 does not hinder the incidence of the light L onto the surface 16a of the photocatalyst layer 16, the utilization efficiency of the light L can be made high. In addition, the photocatalyst electrode 10 is, for example, a flat plate-shaped substrate 12, so as not to hinder the flow of the electrolytic aqueous solution AQ, and the entire photocatalyst electrode 10 is flat plate-shaped.

In an artificial photosynthesis module 50b illustrated in FIG. 19, a diaphragm 43 is provided within the container 40 and a first compartment 43a on the transparent member 44 side and a second compartment 43b on the bottom surface 42b are formed. The photocatalyst electrode 52 is disposed in the first compartment 43a, and the photocatalyst electrode 10 is disposed in the second compartment 43b. The photocatalyst electrode 10 and the photocatalyst electrode 52 are electrically connected to each other.

The first compartment 43a are provided with a supply pipe 46a and a discharge pipe 48a. The second compartment 43b is provided with a supply pipe 46b and a discharge pipe 48b. The electrolytic aqueous solution AQ is supplied from the supply pipe 46a and the supply pipe 46b. From the discharge pipe 48a, the electrolytic aqueous solution AQ including oxygen gas is discharged and the oxygen gas is recovered. From the discharge pipe 48b, the electrolytic aqueous solution AQ including hydrogen gas is discharged and the hydrogen gas is recovered.

The diaphragm 43 becomes transparent in a case where the diaphragm is wetted in the electrolytic aqueous solution AQ, the photocatalyst electrode 10 can be irradiated with the light L from the outside, and generated dissolved hydrogen and oxygen are transmitted through the diaphragm, but bubbled hydrogen gas and oxygen gas are not transmitted through the diaphragm. For example, a membrane filter, a porous plastic, porous glass, non-woven paper, and the like can be used for the diaphragm 43.

Additionally, as the diaphragm 43 that becomes transparent in a case where the diaphragm is wetted in the electrolytic aqueous solution AQ, there is a membrane filter made by Merck KGaA. In addition to this, as the diaphragm 43, for example, a proton transportation film is used, specifically, Nafion (registered trademark) is used.

Here, the term "transparent" means that the light transmittance is at least 60% or more, preferably 80% or more, more preferably 85%, and still more preferably 90%, in a visible light region having a wavelength of 450 to 800 nm. It is preferable that the transparent member 44 also satisfy the specifications of the above-described "transparent".

The light transmittance is measured, for example, using "How to Find Plastic-Total Light Transmittance and Total Light Reflectance" that is specified in Japanese Industrial Standard (JIS) K 7375:2008.

It is preferable that the thickness of the diaphragm 43 is 1 mm or less. In a case where the thickness of the diaphragm 43 is 1 mm or less, mixing of generated gases can be suppressed, and sufficient light L can be radiated to the photocatalyst layer 16 of the photocatalyst electrode 10.

Also in the artificial photosynthesis module 50b illustrated in FIG. 19, the same effects as those of the artificial photosynthesis module 50a illustrated in FIG. 18 can be obtained.

In addition, in the artificial photosynthesis module 50a illustrated in FIG. 18 and the artificial photosynthesis module 50b illustrated in FIG. 19, the photocatalyst electrode 10 has been described as an example. However, the invention is not limited to this, and any of the above-described photocatalyst electrodes can be used.

$H_3BO_3$ adjusted to pH 9.5 is preferable for the electrolytic aqueous solution AQ of the artificial photosynthesis module 50a illustrated in FIG. 18 and the artificial photosynthesis module 50b illustrated in FIG. 19. Additionally, in the artificial photosynthesis module 50a illustrated in FIG. 18 and the artificial photosynthesis module 50b illustrated in FIG. 19, it is desirable to dispose the oxygen-generating photocatalyst electrode 52 and the hydrogen-generating photocatalyst electrode 10 in this order with respect to the incidence side of the light L as described above.

Next, the configuration of the laminate of the photocatalyst electrode will be more specifically described.

Figure 20:
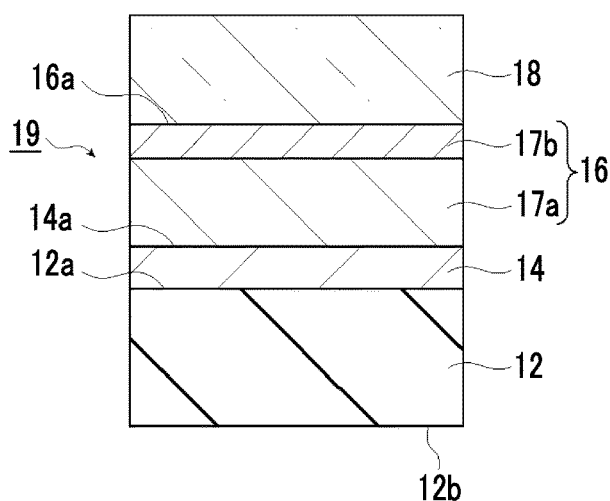
FIG. 20 is a schematic sectional view illustrating a first example of a laminate of the photocatalyst electrode of the embodiment of the invention.
Figure 21:
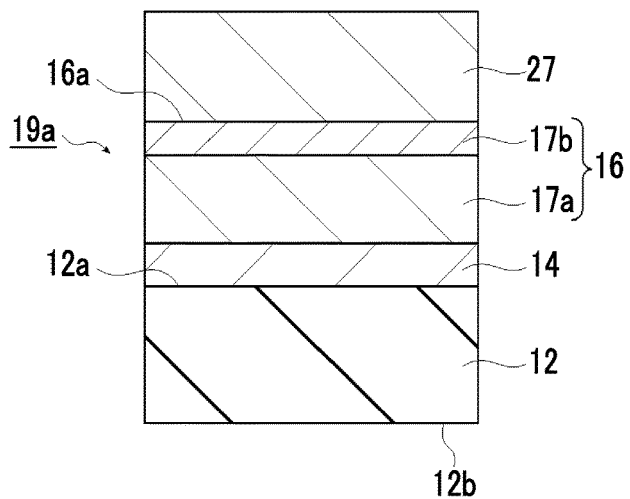
FIG. 21 is a schematic sectional view illustrating a second example of the laminate of the photocatalyst electrode of the embodiment of the invention.
Figure 22:
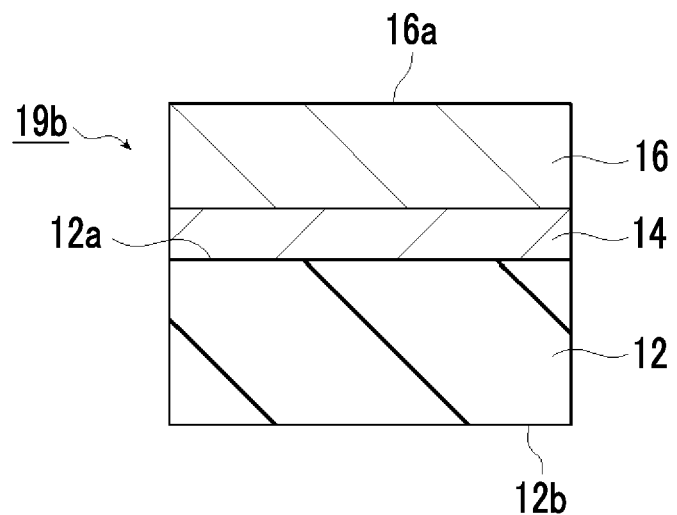
FIG. 22 is a schematic sectional view illustrating a third example of the laminate of the photocatalyst electrode of the embodiment of the invention.

FIG. 20 is a schematic sectional view illustrating a first example of the laminate of the photocatalyst electrode of the embodiment of the invention, FIG. 21 is a schematic sectional view illustrating a second example of the laminate of the photocatalyst electrode of the embodiment of the invention, and FIG. 22 is a schematic sectional view illustrating a third example of the laminate of the photocatalyst electrode of the embodiment of the invention.

As in the laminate 19 illustrated in FIG. 20, the substrate 12 supports the laminate 19, and is configured to have an electrical insulating property. Although the substrate 12 is not particularly limited, for example, a soda lime glass substrate (hereinafter referred to as an SLG substrate) or a ceramic substrate can be used. Additionally, a substrate in which an insulating layer is formed on a metal substrate can be used as the substrate 12. Here, as the metal substrate, a metal substrate, such as an Al substrate or a steel use stainless (SUS) substrate, or a composite metal substrate, such as a composite Al substrate formed of a composite material of Al, and for example, other metals, such as SUS, is available. In addition, the composite metal substrate is a kind of the metal substrate, and the metal substrate and the composite metal substrate are collectively and simply referred to as a metal substrate. Moreover, a metal substrate with an insulating film having an insulating layer formed by anodizing a surface of the Al substrate or the like can also be used as the substrate 12. The substrate 12 may be flexible or may not be flexible. In addition, in addition to the above-described substrates, for example, a glass plate formed of high strain point glass, non-alkali glass, or the like, or a polyimide substrate can also be used as the substrate 12.

The thickness of the substrate 12 is not particularly limited, may be about 20 to 2000 μm, is preferably 10 to 1000 μm, and is more preferably 100 to 500 μm. In addition, in a case where one including a copper indium gallium (di) selenide (CIGS) compound semiconductor is used as a p-type semiconductor layer 17a, photoelectric conversion efficiency is improved in a case where alkali ions (for example, sodium (Na) ions: Na+) are supplied to the substrate 12 side. Thus, it is preferable to provide an alkali supply layer that supplies the alkali ions to a surface 12a of the substrate 12. In addition, in the case of the SLG substrate, the alkali supply layer is unnecessary.

Hereinafter, the conductive layer 14, the photocatalyst layer 16, and a co-catalyst suitable for the hydrogen-generating photocatalyst electrode will be described.

<Conductive Layer>

The conductive layer 14 applies a voltage to the photocatalyst layer 16. Although the conductive layer 14 is not particularly limited as long as the conductive layer has conductivity, the conductive layer 14 is formed of, for example, metals, such as Mo, Cr, and W, or combinations thereof. The conductive layer 14 may have a single-layer structure, or may have a laminate structure, such as a two-layer structure. Among these, it is preferable that the conductive layer 14 is formed of Mo. It is preferable that the conductive layer 14 has a thickness of 200 to 1000 nm.

<Photocatalyst Layer>

The photocatalyst layer 16 generates electric potential. The photocatalyst layer 16 has the p-type semiconductor layer 17a and an n-type semiconductor layer 17b, and the p-type semiconductor layer 17a forms a pn junction at an interface between the p-type semiconductor layer 17a and the n-type semiconductor layer 17b.

The photocatalyst layer 16 is a layer that absorbs the light which has been transmitted through the transparent conductive layer 18 and the n-type semiconductor layer 17b and has reached the photocatalyst layer, and generates holes on a p side and electrons on an n side. The p-type semiconductor layer 17a has a photoelectric conversion function. In the p-type semiconductor layer 17a, holes generated in the pn junction are moved from the p-type semiconductor layer 17a to the conductive layer 14 side, and electrons generated in the pn junction are moved from the n-type semiconductor layer 17b to the transparent conductive layer 18 side. The film thickness of the p-type semiconductor layer 17a is preferably 1000 to 3000 nm.

The optical semiconductors constituting the p-type semiconductor layer 17a are optical semiconductors containing at least one kind of metallic element. Among these, from a viewpoint of more excellent onset potential, higher photocurrent density, or more excellent durability against continuation irradiation, as metallic elements, Ti, V, Nb, Ta, W, Mo, Zr, Ga, In, Zn, Cu, Ag, Cd, Cr, or Sn is preferable, and Ga, In, Zn, Cu, Zr, or Sn is more preferable.

Additionally, the optical semiconductor includes oxides, nitrides, oxynitrides, (oxy)calcogenides, and the like including the above-described metallic elements, and is preferably constituted with GaAs, GaInP, AlGaInP, CdTe, CuInGaSe, CIGS compound semiconductors including a chalcopyrite crystal structure, or CZTS compound semiconductors, such as $Cu_2ZnSnS4$.

It is particularly preferable that the CIGS compound semiconductor is constituted with a CIGS compound semiconductor or a CZTS compound semiconductor of $Cu_2ZnSnS_4$ or the like, which has a chalcopyrite crystal structure.

The CIGS compound semiconductor layer may be constituted of $CuInSe_2$ (CIS), $CuGaSe_2$ (CGS), or the like as well as $Cu(In, Ga)Se_2$ (CIGS).

In addition, as methods for forming the CIGS compound semiconductor layer, 1) a multi-source vapor deposition method, 2) a selenide method, 3) a sputtering method, 4) a hybrid sputtering method, 5) a mechanochemical process method, and the like are known.

Other methods for forming the CIGS compound semiconductor layer include a screen printing method, a proximity sublimating method, a metal organic chemical vapor deposition (MOCVD) method, a spraying method (wet film formation method), and the like. For example, in the screen printing method (wet film formation method), a spraying method (wet film formation method), a molecular beam epitaxy (MBE) method, or the like, crystal having a desired composition can be obtained by forming a particulate film including an 11 group element, a 13 group element, and a 16 group element on a substrate, and executing thermal decomposition processing (may be thermal decomposition processing in a 16 group element atmosphere in this case) or the like (JP1997-74065A(JP-H09-74065A), JP1997-74213A (JP-H09-74213A), or the like). Hereinafter, a CIGS compound semiconductor layer is also simply referred to as a CIGS layer.

The n-type semiconductor layer 17b forms the pn junction at the interface between the n-type semiconductor layer 17b and the p-type semiconductor layer 17a as described above. Additionally, light is transmitted through the n-type semiconductor layer 17b in order to make the light incident on the transparent conductive layer 18 reach the p-type semiconductor layer 17a.

It is preferable that the n-type semiconductor layer 17b is formed of one including metal sulfide including at least one kind of metallic element selected from a group consisting of, for example, Cd, Zn, Sn, and In, such as CdS, ZnS, Zn(S, O), and/or Zn (S, O, OH), SnS, Sn(S, O), and/or Sn(S, O, OH), InS, In (S, O), and/or In (S, O, OH). It is preferable that the film thickness of the n-type semiconductor layer 17b is 20 to 100 nm. The n-type semiconductor layer 17b is formed by, for example, a chemical bath deposition (CBD) method.

In a case where a pn junction consisting of an inorganic semiconductor can be formed, a photodegradation reaction of water can be caused, and hydrogen can be generated, the configuration of the photocatalyst layer 16 is not particularly limited.

For example, photoelectric conversion elements used for solar battery cells that constitute a solar battery are preferably used. As such photoelectric conversion elements, in addition to those using the above-described CIGS compound semiconductor or CZTS compound semiconductor such as $Cu_2ZnSnS_4$, thin film silicon-based thin film type photoelectric conversion elements, CdTe-based thin film type photoelectric conversion elements, dye-sensitized thin film type photoelectric conversion elements, or organic thin film type photoelectric conversion elements can be used.

The transparent conductive layer 18 is for electrically connecting the photocatalyst layer 16 and the first co-catalyst 20 to each other. Transparency, water resistance, and water impermeability are also required for the transparent conductive layer 18, and the durability of the laminate 19 is improved by the transparent conductive layer 18.

It is preferable that the transparent conductive layer 18 is formed of, for example, metals, conductive oxides (of which the overvoltage is equal to or lower than 0.5 V), or composites thereof. The transparent conductive layer 18 is appropriately selected in accordance with the absorption wavelength of the p-type semiconductor layer 17a and the n-type semiconductor layer 17b. Transparent conductive films formed of ZnO that is doped with indium tin oxide (ITO), fluorine-doped tin oxide (FTO), Al, B, Ga, In, or the like, or IMO ($In_2O_3$ to which Mo is added) can be used for the transparent conductive layer 18. The transparent conductive layer 18 may have a single-layer structure, or may have a laminate structure, such as a two-layer structure. Additionally, the thickness of the transparent conductive layer 18 is not particularly limited, and is preferably 30 to 500 nm.

In addition, although methods for forming the transparent conductive layer 18 are not particularly limited, a vacuum deposition method is preferable. The transparent conductive layer 46 can be formed by vapor phase film formation methods, such as an electron beam vapor deposition method, a sputtering method, or a chemical vapor deposition (CVD) method. The transparent conductive layer 18 is not necessarily provided. In this case, the configuration of a laminate 19a illustrated in FIG. 21 is obtained. The protective film 27 may be provided on the surface 16a of the photocatalyst layer 16. The protective film 27 is as described above.

<Co-Catalyst>

As the co-catalysts, it is preferable that, for example, Pt, Pd, Ni, Ag, Ru, Cu, Co, Rh, Ir, Mn, and $RuO_2$ are used.

In a laminate 19b illustrated in FIG. 22, the photocatalyst layer 16 is not pn-junction two-layer structure but a single-layer structure. Since the other configuration is the same as that of the laminate 19 of FIG. 20, the detailed description thereof will be omitted. The laminate 19b illustrated in FIG. 22 is suitable for generation of oxygen. In the laminate 19b illustrated in FIG. 22, the substrate 12 is as described above. Therefore, although the substrate 12 is omitted, the conductive layer 14 and the photocatalyst layer 16 will be described.

Hereinafter, the conductive layer 14, the photocatalyst layer 16, and a co-catalyst 58 (refer to FIGS. 18 and 19) suitable for the oxygen-generating photocatalyst electrode will be described.

<Conductive Layer>

The conductive layers 14 support the photocatalyst layers and a coating layer. As the conductive layers, well-known conductive layers may be used. For example, it is preferable to use conductive layers formed of metals, nonmetals, such as carbon (graphite), or conductive materials, such as conductive oxides. Among these, it is preferable to use the conductive layer 14 that is formed of transparent conductive oxides. The term "transparent" in the conductive layer 14 is the same as the "transparent" in the above-described transparent conductive layer 18.

<Photocatalyst Layer>

As the optical semiconductors constituting the oxygen-generating photocatalyst layer 16, well-known photocatalysts may be used, and optical semiconductors containing at least one kind of metallic element are used.

Among these, from a viewpoint of more excellent onset potential, higher photocurrent density, or more excellent durability against continuation irradiation, as metallic elements, Ti, V, Nb, Ta, W, Mo, Zr, Ga, In, Zn, Cu, Ag, Cd, Cr, or Sn is preferable, and Ti, V, Nb, Ta, or W is more preferable.

Additionally, optical semiconductors include oxides, nitrides, oxynitrides, sulfides, selenides, and the like, which include the above metallic elements.

Additionally, the optical semiconductors are usually included as a main component in the photocatalyst layers. The main component means that the optical semiconductors are equal to or more than 80% by mass with respect to the total mass of a photocatalyst layer, and preferably equal to or more than 90% by mass. Although an upper limit of the main component is not particularly limited, the upper limit is 100% by mass.

Specific examples of the optical semiconductors may include, for example, oxides, such as $Bi_2WO_6$, $BiVO_4$, $BiYWO_6$, $In_2O_3(ZnO)_3$, $InTaO_4$, and $InTaO_4$:Ni ("optical semiconductor: M" shows that the optical semiconductors are doped with M. The same applies below). $TiO_2$:Ni, $TiO_2$:Ru, $TiO_2$Rh, and $TiO_2$: Ni/Ta ("optical semiconductor: M1/M2" shows that the optical semiconductors are doped with M1 and M2. The same applies below), $TiO_2$:Ni/Nb, $TiO_2$:Cr/Sb, $TiO_2$:Ni/Sb, $TiO_2$:Sb/Cu, $TiO_2$:Rh/Sb, $TiO_2$: Rh/Ta, $TiO_2$:Rh/Nb, $SrTiO_3$:Ni/Ta, $SrTiO_3$:Ni/Nb, $SrTiO_3$: Cr, $SrTiO_3$:Cr/Sb, $SrTiO_3$:Cr/Ta, $SrTiO_3$:Cr/Nb, $SrTiO_3$:Cr/W, $SrTiO_3$:Mn, $SrTiO_3$:Ru, $SrTiO_3$:Rh, $SrTiO_3$:Rh/Sb, $SrTiO_3$:Ir, $CaTiO_3$:Rh, $La_2Ti_2O_7$:Cr, $La_2Ti_2O_7$:Cr/Sb, $La_2Ti_2O_7$:Fe, $PbMoO_4$:Cr, $RbPb_2Nb_3O_{10}$, $HPb_2Nb_3O_{10}$, $PbBi_2Nb_2O_9$, $BiVO_4$, $BiCu_2VO_6$, $BiSn_2VO_6$, $SnNb_2O_6$, $AgNbO_3$, $AgVO_3$, $AgLi_{1/3}Ti_{2/3}O_2$, $AgLi_{1/3}Sn_{2/3}O_2$, $WO_3$, $BaBi_{1-x}In_xO_3$, $BaZr_{1-x}Ge_xO_3$, and $BaZr_{1-x}Si_xO_3$, oxynitrides, such as $LaTiO_2N$, $Ca_{0.25}La_{0.75}TiO_{2.25}N_{0.75}$, TaON, $CaNbO_2N$, $BaNbO_2N$, $CaTaO_2N$, $SrTaO_2N$, $BaTaO_2N$, $LaTaO_2N$, $Y_2Ta_2O_5N_2$, $(Ga_{1-x}Zn_x)(N_{1-x}O_x)$, $(Zn_{1+x}Ge)(N_2O_x)$ (x represents a numerical value of 0 to 1), and $TiN_xO_yF_z$, nitrides, such as NbN and $Ta_3N_5$, sulfides, such as CdS, selenide, such as CdSe, oxysulfide compounds Chemistry Letters, 2007, 36, 854 to 855) including $Ln_2Ti_2S_2O_5$ (Ln: Pr, Nd, Sm, Gd, Tb, Dy, Ho, and Er), La, and In, the optical semiconductors are not limited to the materials exemplified here.

Among these, as the optical semiconductors, $BaBi_{1-x}In_xO_3$, $BaZr_{1-x}Sn_xO_3$, $BaZr_{1-x}Ge_xO_3$, $BaZr_{1-x}Si_xO_3$, NbN, $TiO_2$, $WO_3$, TaON, $BiVO_4$, or $Ta_3N_5$, AB(O, N)$_3$ {A=Li, Na, K, Rb, Cs, Mg, Ca, Sr, Ba, La, or Y, B=Ta, Nb, Sc, Y, La, or Ti} having a perovskite structure; solid solutions including AB(O, N)$_3$ having the above-described perovskite structure as a main component; or doped bodies including TaON, $BiVO_4$, $Ta_3N_5$, or AB(O, N)$_3$ having the perovskite structure as a main component are preferable.

The shape of the optical semiconductors included in the photocatalyst layers are not particularly limited, and include a film shape, a columnar shape, a particle shape, or the like.

In a case where the optical semiconductors are particle-shaped, the particle diameter of primary particles thereof is not particularly limited. However, usually, the particle diameter is preferably 0.01 μm or more, and more preferably, 0.1 μm or more, and usually, the particle diameter is preferably 50 μm or less preferably 10 μm or less.

The above-described particle diameter is an average particle diameter, and is obtained by measuring the particle diameters (diameters) of 100 certain optical semiconductors observed by a transmission electron microscope (TEM) or a scanning electron microscope (SEM) and arithmetically averaging these particle diameters. In addition, major diameters are measured in a case where the particle shape is not a true circle.

In a case where the optical semiconductors are columnar, it is preferable that the columnar optical semiconductors extend in a normal direction of surfaces of the conductive layers. Although the diameters of the columnar optical semiconductors are particularly limited, usually, the diameter is preferably 25 nm or more, and more preferably, 50 nm or more, and usually, the diameter is preferably 20 μm or less and preferably 10 μm or less. The above-described diameter is an average diameter and is obtained by measuring the diameters of 100 certain columnar optical semiconductors observed by TEM (Device name: H-8100 of Hitachi High Technologies Corporation) or SEM (Device name: SU-8020 type SEM of Hitachi High Technologies Corporation) and arithmetically averaging the diameters.

Although the thickness of the oxygen-generating photocatalyst layer 16 is not limited, from a viewpoint of more excellent water decomposition efficiency of optical electrodes for decomposing water, 0.01 to 3.0 μm is preferable, and 0.1 to 2.0 μm more preferable.

The above-described method for forming the oxygen-generating photocatalyst layer 16 is not limited, and well-known methods (for example, a method for depositing particle-shaped optical semiconductors on the substrates) can be adopted. The formation methods include, specifically, vapor phase film formation methods, such as an electron beam vapor deposition method, a sputtering method, and a chemical vapor deposition (CVD) method; a transfer method described in Chem. Sci., 2013, 4, and 1120 to 1124; and a method described in Adv. Mater., 2013, 25, and 125 to 131.

In addition, the other layer (for example, an adhesive layer) may be included between a substrate and a photocatalyst layer as needed.

Hereinafter, a method of making a $BiVO_4$ layer will be described as an example of the photocatalyst layer 16.

First, a solution in which bismuth nitrate pentahydrate and sodium iodide are dissolved with nitric acid is prepared. This solution is mixed with a solution in which 1,4-benzoquinone is dissolved in ethanol, and ultrasonic waves are applied to dissolve the mixed solution. The made solution is put into a container for electrodeposition (a three-electrode system cell), a substrate is set for a working electrode, Ag/AgCl is set for a reference electrode, and a platinum wire is set for a counter electrode. Electrodeposition is performed for 10 minutes while the working electrode maintains a potential range of −0.1 to −0.3 V with respect to the reference electrode. A BiOI thin film precursor is obtained by drying the electrodeposited electrodes.

Next, after the BiOI thin film precursor is immersed in a dimethyl sulfoxide solution of bis (acetylacetonato) vanadyl, baking is performed. After the baking, a vanadium oxide remaining on the film surface is removed by being immersed in a sodium hydroxide aqueous solution. In this way, the $BiVO_4$ layer can be formed as the photocatalyst layer 16. In addition, for example, a substrate on which an indium tin oxide (ITO) layer is formed on one face of a soda lime glass base material is used for a substrate on which the $BiVO_4$ layer is to be formed. The $BiVO_4$ layer is formed on the ITO layer of the above-described substrate.

<Co-Catalyst>

As the co-catalyst 58, for example, single substances constituted with Pt, Pd, Ni Au, Ag, Ru Cu, Co, Rh, Ir, Mn, Fe, or the like, alloys obtained by combining these single substances, and oxides of these single substances, for example, NiOx and $RuO_2$, may be used.

The invention is basically configured as described above. Although e photocatalyst electrode and the artificial photosynthesis module of the invention has been described above in detail, it is natural that the invention is not limited to the above-described embodiment, and various improvements and modifications may be made without departing from the scope of the invention.

EXAMPLES

Hereinafter, the features of the invention will be more specifically described with reference to examples. Materials, reagents, amounts used, the substance amounts, ratios, treatment contents, treatment procedures, and the like that are shown in the following examples can be appropriately changed, unless departing from the spirit of the invention.

Therefore, the scope of the invention should not be restrictively interpreted by the specific examples shown below.

In the present examples, photocatalyst electrodes of Examples 1 to 9, and Comparative Example 1 were made, and current densities and decreasing rates of the current densities after one-hour continuous driving were measured. The results are illustrated in the following Table 1.

Each of the photocatalyst electrodes of Examples 1 to 9 and Comparative Example 1 was disposed within a container filled with an electrolytic solution (to be described below) and a reference electrode and the counter electrode are disposed. Then, the photocatalyst electrode, the reference electrode, and the counter electrodes were connected to a potentiostat. In this case, the photocatalyst electrode is a working electrode.

The current densities and the decreasing rates of the current densities after one-hour continuous driving were obtained by irradiating the photocatalyst electrodes of Examples 1 to 9 and Comparative Example 1 with pseudo-solar light, respectively, to measuring photocurrents. The photocurrents were measured within a preset potential range of 0 to +0.7 $V_{RHE}$. The reaction efficiency was evaluated in current densities (mA/cm$^2$) at 0.6 $V_{RHE}$.

A light source of the pseudo-solar light, the electrolytic solution, the reference electrode, the counter electrodes, and the potentiostat are shown below.

Light source of pseudo-solar light: solar simulator (Air mass (AM) 1.5 G), XES-70S1 made by SAN-EI ELECTRIC CO. LTD Electrolytic solution: 0.5M $Na_2SO_4$+0.25M $Na_2HPO_4$+0.25M $NaH_2PO_4$ pH7

Electrochemical measuring device: potentiostat, HZ-5000 made by HUKUTO DENKO CORP.

Reference electrode: Ag/AgCl electrode

Counter electrode: platinum wire

Next, the photocatalyst electrodes of Example 1 to 9 and Comparative Example 1 will be described.

Example 1

A soda lime glass substrate having a thickness of 1 mm was prepared as a substrate, and a molybdenum film having a thickness of 500 nm was formed on a surface of this soda lime glass substrate by the sputtering method to obtain a conductive layer. Next, a CIGS layer having a thickness of 1500 nm was formed as a p-type semiconductor layer on the conductive layer. Next, a CdS layer having a thickness of 50 nm was formed as an n-type semiconductor layer on the p-type semiconductor layer by the chemical bath deposition (CBD) method. A photocatalyst layer was formed of the p-type semiconductor layer and the n-type semiconductor layer. Hereinafter, the substrate in this state is referred to as a CIGS substrate. The CIGS substrate was cut into 1 cm×1 cm.

Next, Pt particles were made to be carried and supported with a set film thickness of 2 nm on the n-type semiconductor layer by the sputtering method to obtain an island-like second co-catalyst. Next, an indium tin oxide (ITO) layer having a thickness of 100 nm was formed as a transparent conductive layer on a back face opposite to the CIGS layer of the substrate by the sputtering method. Next, the Pt particles were made to be carried and supported with a set film thickness of 2 nm on the n-type semiconductor layer and the transparent conductive layer by a sputtering method to obtain an island-like first co-catalyst.

Next, the second co-catalyst and the transparent conductive layer were electrically connected to each other with a conducting wire. Then, the conducting wire was fixed using a conductive adhesive containing silver paste, and was covered with epoxy resin, and was electrically insulated.

The installation area of the Pt particles of the first co-catalyst was the same area as the photocatalyst layer using a mask, and the installation area of the Pt particles of the second co-catalyst was also the same area as the photocatalyst layer.

In addition, the configuration of Example 1 is the same configuration as the photocatalyst electrode 10c illustrated in FIG. 6.

Example 2

Since Example 2 is different from Example 1 in that a Pt film having a thickness of 50 nm was made as the first co-catalysts by the sputtering method, the second co-catalyst and the Pt film were electrically connected to each other with the conducting wire, the conducting wire was fixed using the conductive adhesive containing silver paste, was covered with the epoxy resin, and was electrically insulated from each other, and is the same as Example 1 excluding these, the detailed description thereof will be omitted.

In addition, the configuration of Example 2 is the same configuration as the photocatalyst electrode 10d illustrated in FIG. 7.

Example 3

Since Example 3 is different from Example 1 in that a Pt mesh having an area 3 times greater than the area of the p-type semiconductor layer, that is, the photocatalyst layer was used as the first co-catalysts by the sputtering method, the second co-catalyst and the Pt mesh were electrically connected to each other with the conducting wire, the conducting wire was fixed using the conductive adhesive containing silver paste, was covered with the epoxy resin, and was electrically insulated from each other, and is the same as Example 1 excluding these, the detailed description thereof will be omitted. The installation area of Example 3 where a co-catalyst is provided is 4 times greater than the area of the photocatalyst layer.

In addition, the configuration of Example 3 is the same configuration as the photocatalyst electrode 10e illustrated in FIG. 8. A platinum mesh electrode that is made by EC Frontier CO., LTD. and has 80 meshes was used for the Pt mesh.

Example 4

Since Example 4 is different from Example 1 in that the second co-catalyst was not provided, an ITO layer having a thickness of 100 nm was formed as the transparent conductive layer on the n-type semiconductor layer, a protective film covering transparent conductive layer was formed, the Pt mesh having an area 3 times greater than the area of the p-type semiconductor layer, that is, the photocatalyst layer was used as the first co-catalysts by the sputtering method, the second co-catalyst and the Pt mesh were electrically connected to each other with the conducting wire, the conducting wire was fixed using the conductive adhesive containing silver paste, was covered with the epoxy resin, and was electrically insulated from each other. Since the other configuration is the same as that of Example 1, the detailed description thereof will be omitted. The protective film was formed using a TiO$_2$ film having a thickness of 20 nm by the atomic layer deposition (ALD) method. In addition, the configuration of Example 4 is the same configuration as the photocatalyst electrode 10f illustrated in FIG. 9.

Example 5

Since Example 5 is the same as Example 4 except for a configuration in which the Pt mesh has an area 6 times greater than the area of the photocatalyst layer, that is, the p-type semiconductor layer compared with Example 4, the detailed description thereof will be omitted. In addition, the configuration of Example 5 is the same configuration as the photocatalyst electrode 10g illustrated in FIG. 10.

Example 6

Since Example 6 is the same as Example 4 except for a configuration in which the Pt mesh has an area 9 times greater than the area of the photocatalyst layer, that is, the p-type semiconductor layer compared with Example 4, the detailed description thereof will be omitted. In addition, the configuration of Example 6 is the same configuration as the photocatalyst electrode 10h illustrated in FIG. 11.

Example 7

Since Example 7 is different from Example 1 in that the second co-catalyst was not provided, the ITO layer having a thickness of 100 nm was formed as the transparent conductive layer on the n-type semiconductor layer, the protective film covering transparent conductive layer was formed, the transparent conductive layer on the surface side of the substrate the transparent conductive layer on the back face side of the substrate were electrically connected to each other with the conducting wire, the conducting wire was fixed using the conductive adhesive containing silver paste, was covered with the epoxy resin, and was electrically insulated from each other, and is the same as Example 1 excluding these, the detailed description thereof will be omitted.

The protective film was formed using a $TiO_2$ film having a thickness of 20 nm by the atomic layer deposition (ALD) method. In addition, the configuration of Example 7 is the same configuration as the photocatalyst electrode 10m illustrated in FIG. 13.

Example 8

Since Example 8 is the same as Example 2 except for a configuration in which the Pt film of the first co-catalyst is an Rh film compared with Example 2, the detailed description thereof will be omitted. In addition, the configuration of Example 8 is the same configuration as the photocatalyst electrode 10d illustrated in FIG. 7.

Example 9

Since Example 9 is the same as Example 1 except for a configuration in which the transparent conductive layer was formed on the surface side of the substrate of the photocatalyst layer, and the protective film covering the transparent conductive layer was formed compared with Example, and the detailed description thereof will be omitted.

In Example 9, the transparent conductive layer on the surface side of the substrate and the transparent conductive layer on the back face side of the substrate were electrically connected to each other with conducting wire, the conducting wire was fixed using the conductive adhesive containing silver paste, and was covered with the epoxy resin, and was electrically insulated from each other. The protective film was formed using a $TiO_2$ film having a thickness of 20 nm by the atomic layer deposition (ALD) method.

In addition, the configuration of Example 9 is the same configuration as the photocatalyst electrode 10n illustrated in FIG. 14.

Comparative Example 1

Figure 23:
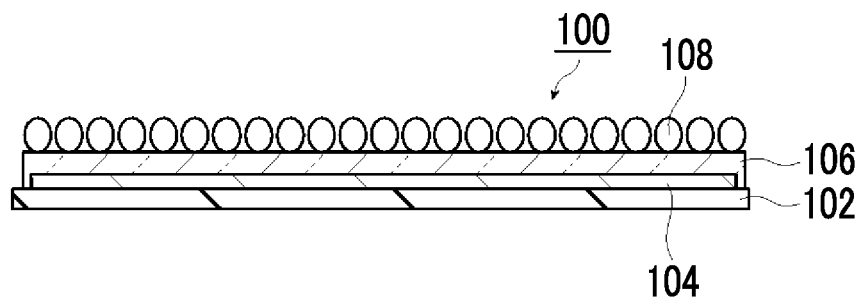
FIG. 23 is a schematic sectional view illustrating a photocatalyst electrode of Comparative Example 1.

The photocatalyst electrode of Comparative Example 1 has a configuration illustrated in FIG. 23, and the second co-catalyst is formed on the photocatalyst layer of the above-described CIGS substrate of 1 cm×1 cm.

In a photocatalyst electrode 100 of Comparative Example 1, a soda lime glass substrate having a thickness of 1 mm was prepared as a substrate 102, and a molybdenum film having a thickness of 500 nm was formed on a surface of this soda lime glass substrate by the sputtering method to obtain a conductive layer 104. Next, a CIGS layer having a thickness of 1500 nm was formed as a p-type semiconductor layer on the conductive layer 104. Next, a CdS layer having a thickness of 50 nm was formed as an n-type semiconductor layer on the p-type semiconductor layer by the chemical bath deposition (CBD) method. A photocatalyst layer 106 was formed of the p-type semiconductor layer and the n-type semiconductor layer. Pt particles as a second co-catalyst 108 were formed by being carried and supported on the photocatalyst layer 106 by the sputtering method. The installation area of the Pt particles of the second co-catalyst was the same area as that of the p-type semiconductor layer. The method of carrying and supporting the Pt particles of the second co-catalyst was the same as the above-described Example 1.

TABLE 1

| | Co-catalyst Area/ Photo-catalyst Area | Second Co-catalyst (Surface Side) | First Catalyst (Back Face) | Current Density 0.6 $V_{RHE}$ | Decreasing Rate of Current Density after One-Hour Continuous Driving |
|---|---|---|---|---|---|
| Example 1 | 2 | Pt Particle | Pt Particle | 3.5 mA/cm² | 5% |
| Example 2 | 2 | Pt Particle | Pt film | 4 mA/cm² | 0% |
| Example 3 | 4 | Pt Particle | Pt Mesh | 4 mA/cm² | 0% |
| Example 4 | 3 | None | Pt Mesh | 5 mA/cm² | 0% |
| Example 5 | 6 | None | Pt Mesh | 6 mA/cm² | 0% |
| Example 6 | 9 | None | Pt Mesh | 6 mA/cm² | 0% |
| Example 7 | 1 | None | Pt Particle | 4 mA/cm² | 20% |
| Example 8 | 2 | Pt Particle | Rh film | 4 mA/cm² | 0% |
| Example 9 | 2 | Pt Particle | Pt Particle | 3.5 mA/cm² | 5% |
| Comparative Example 1 | 1 | Pt Particle | None | 3 mA/cm² | 20% |

As illustrated in Table 1, in Examples 1 to 9, the current densities were greater than that of Comparative Example 1, and the reaction efficiency was excellent. Additionally, the decreasing rates of the current densities after one-hour continuous driving were also approximately equal to or smaller than that of Comparative Example 1, and the durability was excellent.

In the case of the first co-catalyst only, in a case where the area of a co-catalyst was 3 or more times greater than the area of a photocatalyst layer as in Examples 4 to 6, higher current densities were obtained, and more excellent reaction efficiency was obtained. The current densities were not changed in a case where the area of a co-catalyst was 6 or more times greater than the area of a photocatalyst layer as in Examples 5 and 6.

Figure 24:
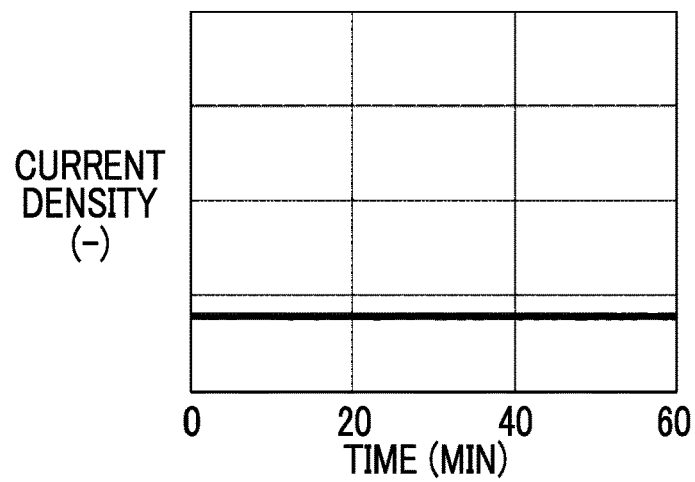
FIG. 24 is a graph illustrating changes in current density in a case where one-hour continuous driving of Example 4 is performed.
Figure 25:
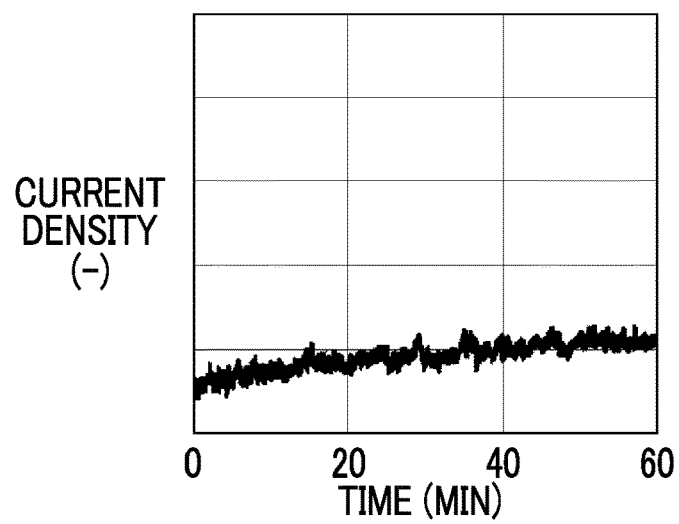
FIG. 25 is a graph illustrating changes in current density in a case where one-hour continuous driving of Comparative Example 1 is performed.

Regarding Example 4 and Comparative Example 1, pseudo-solar light was radiated as described above on the condition of 0 $V_{RHE}$ to perform a water decomposition operation continuously for one hour, photocurrents were measured during that, and changes over time in water decomposition performance were investigated in a case where one-hour continuous driving was performed. The results are illustrated in FIG. 24 regarding Example 4, and the results are illustrated in FIG. 25 regarding Comparative Example 1. In addition, the current densities of the vertical axes are standardized in FIGS. 24 and 25. The photocatalyst electrodes are working electrodes and are equivalent to cathodes. In FIGS. 24 and 25, electric currents on the cathode sides are illustrated, and minus electric currents are taken. For this reason, the closer to 0 in the vertical axes, the higher the current densities.

As illustrated in FIG. 24, even though one-hour continuous driving was performed in Example 4, the value of the current density was not changed from immediately after the start of driving. On the other hand, in Comparative Example 1, in a case where one-hour continuous driving was performed, the current density decreased with time, and the decreasing rate of the current density was large.

EXPLANATION OF REFERENCES 10, 10a, 10b, 10c, 10d, 10e, 10f, 10g, 10h, 10k, 10m, 10n, 10p, 10q, 52, 100: photocatalyst electrode
12, 54, 102: substrate
12a, 14a, 16a, 18a, 25a, 44a: surface
12b, 25b: back face
14: conductive layer
16: photocatalyst layer
17a: p-type semiconductor layer
17b: n-type semiconductor layer
18: transparent conductive layer
18b: side surface
19, 19a, 19b: laminate
20: first co-catalyst
21, 31: co-catalyst particle
22: co-catalyst film
24: wiring line
25: base material
26: co-catalyst mesh material
27: protective film
30: second co-catalyst
40: container
42: housing
42b: bottom surface
42c: first wall surface
42d: second wall surface
43: diaphragm
44: transparent member
46, 46a, 46b: supply pipe
48, 48a, 48b: discharge pipe
50a, 50b: artificial photosynthesis module
56, 106: photocatalyst layer
58: co-catalyst
104: conductive layer
108: second co-catalyst
AQ: electrolytic aqueous solution
D: direction
L: light
$S_1$: first region
$S_2$: second region
$S_{21}$: region
$S_{22}$: region

What is claimed is:

1. A photocatalyst electrode that decomposes water with light to generate gas, the photocatalyst electrode comprising:
   a laminate including a substrate, a conductive layer provided on a surface of the substrate, and a photocatalyst layer provided on a surface of the conductive layer; and
   a first co-catalyst electrically connected to the photocatalyst layer,
   wherein the light is incident from the surface side of the photocatalyst layer of the laminate, and where a region where the light is incident on the surface of the photocatalyst layer and above the surface is defined as a first region and the region other than the first region is defined as a second region, the first co-catalyst is provided at least in the second region, and
   wherein the first co-catalyst and the photocatalyst layer are electrically connected to each other by at least one of a transparent conductive layer provided on the surface of the photocatalyst layer or a wiring line.

2. The photocatalyst electrode according to claim 1, wherein the second region is a region provided on a surface of the substrate opposite to the conductive layer and facing the surface of the substrate opposite to the conductive layer.

3. The photocatalyst electrode according to claim 1, wherein an installation area where the first co-catalyst is provided is more than 1 time and 10 times or less with respect to an installation area where the photocatalyst layer is provided.

4. The photocatalyst electrode according to claim 2, wherein an installation area where the first co-catalyst is provided is more than 1 time and 10 times or less with respect to an installation area where the photocatalyst layer is provided.

5. The photocatalyst electrode according to claim 1, wherein the first co-catalyst is formed of at least one co-catalyst film, a co-catalyst mesh material, a plurality of co-catalyst particles, or the plurality of co-catalyst particles carried and supported on a base material.

6. The photocatalyst electrode according to claim 2, wherein the first co-catalyst is formed of at least one co-catalyst film, a co-catalyst mesh material, a plurality of co-catalyst particles, or the plurality of co-catalyst particles carried and supported on a base material.

7. The photocatalyst electrode according to claim 3, wherein the first co-catalyst is formed of at least one co-catalyst film, a co-catalyst mesh material, a plurality of co-catalyst particles, or the plurality of co-catalyst particles carried and supported on a base material.

8. The photocatalyst electrode according to claim 5, wherein the first co-catalyst has a plurality of the co-catalyst films that are electrically connected to each other.

9. The photocatalyst electrode according to claim 6, wherein the first co-catalyst has a plurality of the co-catalyst films that are electrically connected to each other.

10. The photocatalyst electrode according to claim 5, wherein the first co-catalyst is the co-catalyst mesh material that is folded.

11. The photocatalyst electrode according to claim 6, wherein the first co-catalyst is the co-catalyst mesh material that is folded.

12. The photocatalyst electrode according to claim 1, wherein the gas is hydrogen gas.

13. An artificial photosynthesis module comprising:
a container provided with a photocatalyst electrode,
the photocatalyst electrode that decomposes water with light to generate gas, the photocatalyst electrode comprising:
a laminate including a substrate, a conductive layer provided on a surface of the substrate, and a photocatalyst layer provided on a surface of the conductive layer; and
a first co-catalyst electrically connected to the photocatalyst layer,
wherein the light is incident from the surface side of the photocatalyst layer of the laminate, and where a region where the light is incident on the surface of the photocatalyst layer and above the surface is defined as a first region and the region other than the first region is defined as a second region, the first co-catalyst is provided at least in the second region, and
wherein the first co-catalyst and the photocatalyst layer are electrically connected to each other by at least one of a transparent conductive layer provided on the surface of the photocatalyst layer or a wiring line.

14. The artificial photosynthesis module according to claim 13,
wherein the second region is a region provided on a surface of the substrate opposite to the conductive layer and facing the surface of the substrate opposite to the conductive layer.

15. The artificial photosynthesis module according to claim 13,
wherein an installation area where the first co-catalyst is provided is more than 1 time and 10 times or less with respect to an installation area where the photocatalyst layer is provided.

16. The artificial photosynthesis module according to claim 14,
wherein an installation area where the first co-catalyst is provided is more than 1 time and 10 times or less with respect to an installation area where the photocatalyst layer is provided.

17. The artificial photosynthesis module according to claim 13,
wherein the first co-catalyst is formed of at least one co-catalyst film, a co-catalyst mesh material, a plurality of co catalyst particles, or the plurality of co-catalyst particles carried and supported on a base material.

18. The artificial photosynthesis module according to claim 17,
wherein the first co-catalyst has a plurality of the co-catalyst films that are electrically connected to each other.

19. The artificial photosynthesis module according to claim 17,
wherein the first co-catalyst is the co-catalyst mesh material that is folded.

20. The artificial photosynthesis module according to claim 13,
wherein the gas is hydrogen gas.

* * * * *